US012708046B2

(12) United States Patent
Chen et al.

(10) Patent No.: US 12,708,046 B2
(45) Date of Patent: Aug. 11, 2026

(54) SEMICONDUCTOR DEVICE INCLUDING CROSS-DIE BONDING RING AND METHODS FOR FORMING THE SAME

(71) Applicant: Taiwan Semiconductor Manufacturing Company Limited, Hsinchu (TW)

(72) Inventors: Chen-Shien Chen, Zhubei City (TW); Chih-Hong Wang, Taipei City (TW); Ting Hao Kuo, Hsinchu City (TW); Yu-Chia Lai, Zhunan Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 451 days.

(21) Appl. No.: 18/328,859

(22) Filed: Jun. 5, 2023

(65) Prior Publication Data

US 2024/0404993 A1 Dec. 5, 2024

(51) Int. Cl.
*H10W 90/00* (2026.01)
*H10W 20/20* (2026.01)
(Continued)

(52) U.S. Cl.
CPC .......... *H10W 90/00* (2026.01); *H10W 20/20* (2026.01); *H10W 42/00* (2026.01);
(Continued)

(58) Field of Classification Search
CPC ............. H01L 25/0657; H01L 23/3128; H01L 23/481; H01L 23/49822; H10W 90/00; H10W 20/20; H10W 42/00; H10W 70/685
See application file for complete search history.

(56) References Cited

U.S. PATENT DOCUMENTS 7,448,277 B2 * 11/2008 Gogoi .................. G01L 9/0073 29/25.03
8,154,119 B2 * 4/2012 Yoon .................. H10W 70/635 257/737

(Continued)

FOREIGN PATENT DOCUMENTS

CA 102386166 A 3/2012
CN 102386166 B 4/2015

(Continued)

OTHER PUBLICATIONS

TW Patent and Trademark Office; TW Application No. 112128935; Office Action of Oct. 23, 2024; 14 pages.

(Continued)

*Primary Examiner* — Laura M Menz
(74) *Attorney, Agent, or Firm* — The Marbury Law Group, PLLC

(57) ABSTRACT

A semiconductor die includes lower dies separated by a dielectric region; a cross die vertically stacked on the lower dies and the dielectric region; a molding structure filling the dielectric region and surrounding side surfaces of the lower dies and the cross die; and a bonding ring connecting the cross die to the lower dies and including: an upper metal ring formed in a bottom surface of the cross die; and a lower metal ring formed in top surfaces of the lower dies and extending through the molding structure in the dielectric region. The lower metal ring is bonded to the upper metal ring.

20 Claims, 23 Drawing Sheets

(51) Int. Cl.

| | |
|---|---|
| ***H10W 42/00*** | (2026.01) |
| ***H10W 70/685*** | (2026.01) |
| ***H10W 74/10*** | (2026.01) |
| *H10W 72/90* | (2026.01) |
| *H10W 80/00* | (2026.01) |
| *H10W 90/20* | (2026.01) |

(52) U.S. Cl.

CPC ........ *H10W 70/685* (2026.01); *H10W 74/117* (2026.01); *H10W 72/952* (2026.01); *H10W 80/312* (2026.01); *H10W 90/20* (2026.01); *H10W 90/732* (2026.01); *H10W 90/734* (2026.01)

(56) References Cited

U.S. PATENT DOCUMENTS

| | | | | |
|---|---|---|---|---|
| 8,564,117 | B2 * | 10/2013 | Yoon | H10W 70/635 438/117 |
| 9,469,109 | B2 * | 10/2016 | Faralli | B41J 2/1433 |
| 10,132,712 | B1 * | 11/2018 | Zhang | G01M 3/002 |
| 10,483,239 | B2 * | 11/2019 | Yan | H10W 42/00 |
| 11,001,061 | B2 * | 5/2021 | Faralli | B41J 2/1433 |
| 11,562,975 | B2 * | 1/2023 | Hou | H10W 90/00 |
| 12,027,475 | B2 * | 7/2024 | Chang | H10W 42/00 |
| 12,165,962 | B2 * | 12/2024 | Aleksov | H10W 42/00 |
| 12,315,833 | B2 * | 5/2025 | Zhou | H10W 72/90 |
| 12,379,534 | B2 * | 8/2025 | Zhang | B81C 1/00333 |
| 2006/0019420 | A1 * | 1/2006 | Liao | B81C 1/00801 438/51 |
| 2006/0087013 | A1 * | 4/2006 | Hsieh | H10W 90/00 257/E21.705 |
| 2008/0053236 | A1 * | 3/2008 | Gogoi | B81C 1/00158 29/25.03 |
| 2011/0241196 | A1 * | 10/2011 | Yoon | H10W 70/635 257/E23.068 |
| 2012/0193776 | A1 * | 8/2012 | Yoon | H10W 70/635 257/698 |
| 2016/0031704 | A1 * | 2/2016 | Shen | B81C 1/00238 438/51 |
| 2016/0121607 | A1 * | 5/2016 | Faralli | B41J 2/1433 438/21 |
| 2016/0121612 | A1 * | 5/2016 | Faralli | B41J 2/1433 438/21 |
| 2019/0131255 | A1 * | 5/2019 | Teng | H10W 42/00 |
| 2019/0144265 | A1 * | 5/2019 | Chakravarty | B81B 3/0016 257/415 |
| 2019/0363079 | A1 * | 11/2019 | Thei | H10D 88/00 |
| 2021/0242080 | A1 * | 8/2021 | Weng | H10W 20/023 |
| 2022/0189861 | A1 * | 6/2022 | Aleksov | H10W 42/00 |
| 2022/0216155 | A1 * | 7/2022 | Won | H10W 70/611 |
| 2022/0352104 | A1 * | 11/2022 | Hou | H10W 90/00 |
| 2023/0084280 | A1 * | 3/2023 | Zhang | B81B 7/0067 359/359 |
| 2023/0095134 | A1 * | 3/2023 | Chen | H10P 72/74 257/668 |
| 2024/0120292 | A1 * | 4/2024 | Kim | H10W 42/121 |
| 2024/0178170 | A1 * | 5/2024 | Zhou | H10W 72/90 |
| 2024/0258277 | A1 * | 8/2024 | Kwon | H10W 72/072 |
| 2024/0304601 | A1 * | 9/2024 | Chang | H10W 74/141 |
| 2024/0404993 | A1 * | 12/2024 | Chen | H10W 70/685 |
| 2025/0014978 | A1 * | 1/2025 | Wang | H10W 20/20 |
| 2025/0054881 | A1 * | 2/2025 | Chang | H10W 42/00 |
| 2025/0201775 | A1 * | 6/2025 | Polomoff | H10W 44/601 |

FOREIGN PATENT DOCUMENTS

| | | | | | |
|---|---|---|---|---|---|
| CN | 106082103 | A | * | 11/2016 | B81C 1/00801 |
| CN | 106206529 | A | * | 12/2016 | H10W 70/09 |
| CN | 107226452 | A | * | 10/2017 | B81B 7/0032 |
| CN | 109314101 | A | * | 2/2019 | H10W 90/00 |
| CN | 109643702 | A | * | 4/2019 | H10W 74/117 |
| CN | 107226452 | B | * | 5/2019 | B81B 7/0032 |
| CN | 110299351 | A | * | 10/2019 | H01Q 1/2283 |
| CN | 111348613 | A | * | 6/2020 | B81B 7/0032 |
| CN | 112141995 | A | * | 12/2020 | B81B 7/0006 |
| CN | 110444528 | B | * | 4/2021 | H10W 72/50 |
| CN | 115692376 | A | * | 2/2023 | H10W 90/00 |
| CN | 115954350 | A | * | 4/2023 | |
| CN | 116013873 | A | * | 4/2023 | |
| CN | 116093097 | A | * | 5/2023 | H10W 90/00 |
| CN | 116454049 | A | * | 7/2023 | H10W 70/685 |
| CN | 109314101 | B | * | 12/2023 | H10W 90/00 |
| CN | 117410261 | A | * | 1/2024 | H10W 72/00 |
| CN | 118857275 | A | * | 10/2024 | B81C 1/00801 |
| CN | 222514911 | U | * | 2/2025 | H10W 74/117 |
| CN | 222883542 | U | * | 5/2025 | H10W 90/00 |
| DE | 102024104961 | A1 | * | 4/2025 | H10W 90/00 |
| EP | 3469629 | B1 | * | 9/2025 | H10W 90/00 |
| JP | 2006514438 | A | * | 4/2006 | H10W 70/479 |
| KR | 101088088 | B1 | * | 11/2011 | H10W 90/00 |
| KR | 20190018135 | A | * | 2/2019 | H10W 90/00 |
| KR | 102083138 | B1 | * | 2/2020 | G02B 27/0006 |
| KR | 20200036771 | A | * | 4/2020 | H01L 23/481 |
| KR | 102324012 | B1 | * | 11/2021 | H10W 90/00 |
| KR | 102602714 | B1 | * | 11/2023 | H10W 90/00 |
| KR | 20240117931 | A | * | 8/2024 | H10W 90/00 |
| NL | 2029722 | A | * | 7/2022 | H10W 80/00 |
| TW | 200524067 | A | | 7/2005 | |
| WO | WO-2017215771 | A1 | * | 12/2017 | H10W 90/00 |
| WO | WO-2022132274 | A1 | * | 6/2022 | H10W 80/00 |
| WO | WO-2025131802 | A1 | * | 6/2025 | H10W 20/0245 |

OTHER PUBLICATIONS

TW Patent and Trademark Office; TW Application No. 112128935; Office Action mailed Jun. 4, 2025; 14 pages.

* cited by examiner

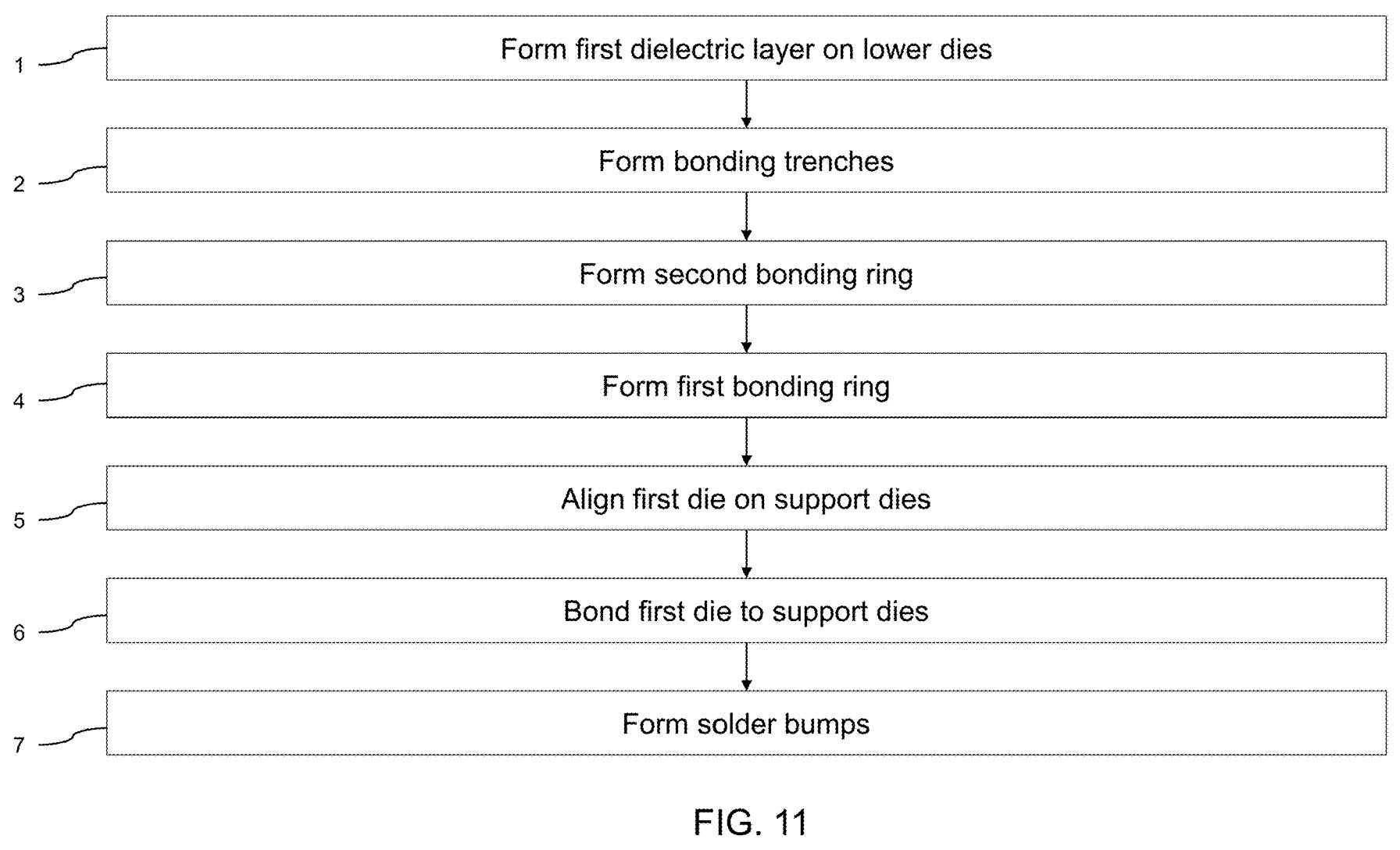

1 Form first dielectric layer on lower dies

2 Form bonding trenches

3 Form second bonding ring

4 Form first bonding ring

5 Align first die on support dies

6 Bond first die to support dies

7 Form solder bumps

FIG. 11

SEMICONDUCTOR DEVICE INCLUDING CROSS-DIE BONDING RING AND METHODS FOR FORMING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a flow diagram of a method of forming a semiconductor device, according to various embodiments of the present disclosure.

DETAILED DESCRIPTION

Figure 1A:
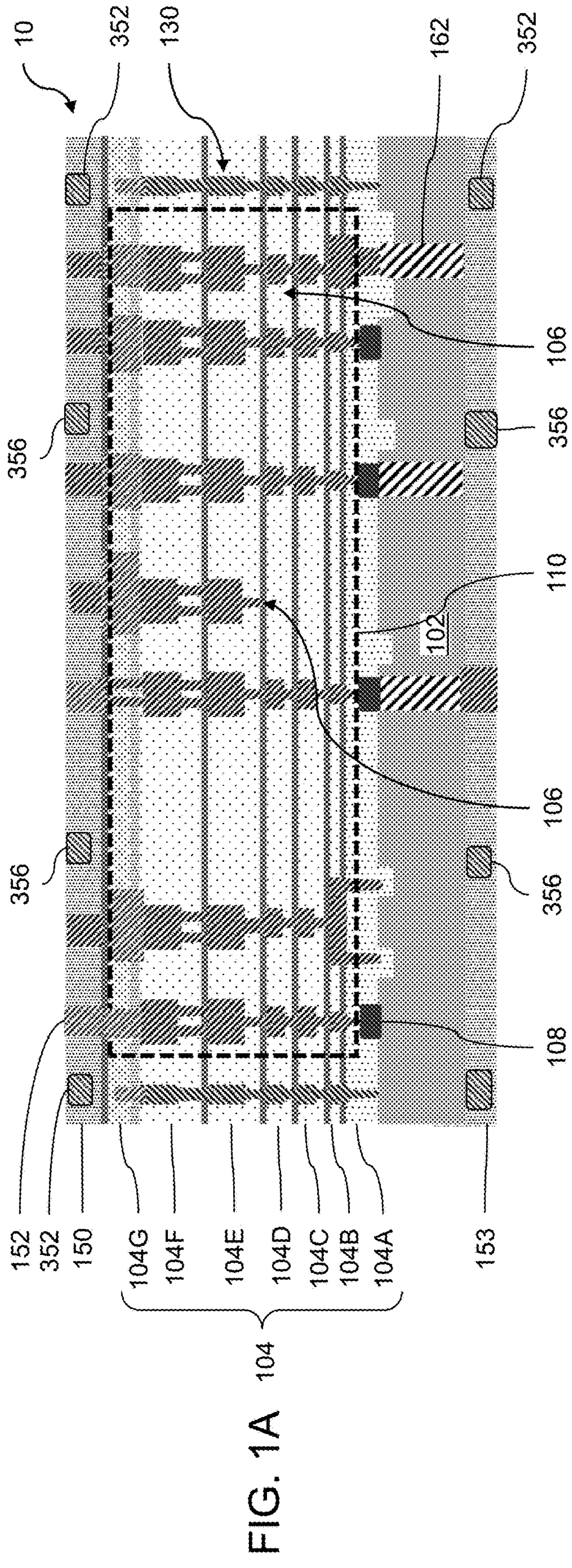
FIG. 1A is a vertical cross-sectional view of a semiconductor die, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

In three-dimensional (3D) semiconductor packages, upper dies and lower dies may be bonded using bonding pads formed in each of the upper dies and lower dies, in order to physically and electrically connect the upper dies and lower dies. Typically, bonding pads are structures having relatively small horizontal cross section surface areas. Consequently, precise alignment of dies is desired to ensure that the bonding pads on upper dies align with bonding pads formed on lower dies. In addition, the relatively small cross section areas of the bonding pads provide relatively week bonds between dies. In instances in which an upper die (e.g., a cross die) is bonded to more than one lower die, gaps between the lower dies may result in bonding pad pattern density variations. Such variations in the bonding pad pattern density may result in enhanced die stress due to copper chemical-mechanical planarization (CMP) loading effects that reduce the flatness of copper to copper bonding interfaces. As a result, the relatively small contact area between bonding pads on the lower die and upper die may be further reduced. In addition, coefficient of thermal expansion (CTE) differences between the upper dies and lower dies as well as with a die gap filling dielectric material may increase cross-dies stress. As a result, high die bonding failure rates may reduce manufacturing yields.

Cross Die Devices

The present disclosure is directed to fusion and/or hybrid bonded stacked semiconductor devices. Fusion bonding may include the fusion of metal elements, such as metal bonding rings, lines, and/or pads. Hybrid bonding may include the bonding of dielectric layers, such as SiOx layers, and the fusion bonding of metal elements. In particular, the present disclosure is directed to cross die semiconductor devices (devices that include a semiconductor die that extends across and is bonded to more than one semiconductor dies) that include bonding structures designed to provide improved bonding strength. In particular, various embodiments provide bonding structures, which may include bonding rings and/or bonding lines, that are configured to provide increased bonding strength when bonding a cross die to any number of bottom dies. Such structures may possess enhanced surface areas to ensure better alignment and overlap as well as increased surface area with which to form a bond. For example, at least a portion of the bonding structure may be located in close proximity to one or more edges of the cross die. In some embodiments, at least a portion of the bonding structure may be located in close proximity to one or more edges of the bottom dies, and in particular, in close proximity to a die gap between the bottom dies that is spanned by the cross die. In still other embodiments, the shape of a bonding structure may be designed to account for variations in the size and/or shape of the upper die as well as one or more lower (bottom) dies.

In various embodiments, the bonding structure may be formed by bonding upper metal rings formed in the cross die (upper die) to lower metal rings formed in the lower (bottom) dies. The widths (and corresponding surface areas) of the upper metal rings and lower metal rings may be designed and configured to ensure sufficient bonding strength, even when semiconductor die misalignment occurs. In other words, the widths and/or surface areas of the upper and lower metal rings may be designed to provide a minimum amount of overlap, even when semiconductor die misalignment occurs. Further, the dimensions of the upper and lower metal rings may be designed to provide sufficient bonding strength when accounting for variations in the thicknesses of the cross die and/or the bottom dies.

Figure 1B:
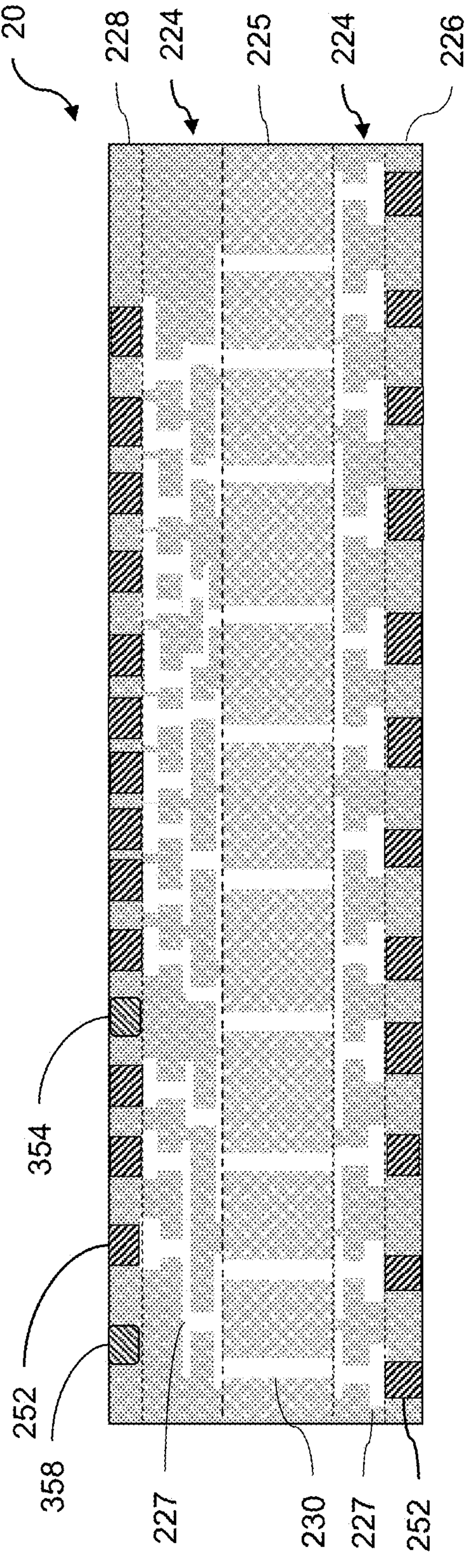
FIG. 1B is a vertical cross-sectional view of an interposer, according to various embodiments of the present disclosure.

FIG. 1A is a vertical cross-sectional view of a semiconductor die 10, according to various embodiments of the present disclosure. FIG. 1B is a vertical cross-sectional view of an interposer 20, according to various embodiments of the present disclosure.

Referring to FIG. 1A, the semiconductor die 10 may be, for example, an application-specific integrated circuit (ASIC) chip, an analog chip, a sensor chip, a wireless and radio frequency chip, a voltage regulator chip, or a memory chip. In some embodiments, the semiconductor die 10 may be an active component or a passive component. In some embodiments, the semiconductor die 10 includes a semiconductor substrate 102, a dielectric structure 104, an interconnect structure 110 embedded within the dielectric structure 104, a seal ring 130, and a TSV structure 162.

In some embodiments, the semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 102 may be a semiconductor-on-insulator (SOI) substrate. In various embodiments, the semiconductor substrate 102 may take the form of a planar substrate, a substrate with multiple fins, nanowires, or other forms known to people having ordinary skill in the art. Depending on the requirements of design, the semiconductor substrate 102 may be a P-type substrate or an N-type substrate and may have doped regions therein. The doped regions may be configured for an N-type device or a P-type device.

In some embodiments, the semiconductor substrate 102 includes isolation structures defining at least one active area, and a first device layer may be disposed on/in the active area. The first device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the first device layer includes a gate structure, source/drain regions, spacers, and the like.

The dielectric structure 104 may be disposed on a front side of the semiconductor substrate 102. In some embodiments, the dielectric structure 104 may include silicon oxide, silicon oxynitride, silicon nitride, a low dielectric constant (low-k) material, or a combination thereof. Other suitable dielectric materials may be within the contemplated scope of disclosure. The dielectric structure 104 may be a single layer or a multiple-layer dielectric structure. For example, as shown in FIG. 1B, the dielectric structure 104 may include multiple dielectric layers 104A-104F, which may include a substrate oxide layer 104A, inter-layer dielectric (ILD) layers 104B-104F, and a passivation layer 104G. However, the present disclosure is not limited to any particular number of layers. Fewer or additional dielectric layers may be included in the dielectric structure 104.

The dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

An interconnect structure 110 may be formed in the dielectric structure 104. The interconnect structure 110 may include metal features 106 disposed in the dielectric structure 104. The metal features 106 may be any of a variety of metal line and via structures that electrically connect the metal lines of adjacent ILD layers 104B-104F. The metal features 106 may be electrically connected to substrate electrodes 108 disposed on the semiconductor substrate 102, such that the interconnect structure 110 may electrically interconnect connect semiconductor devices formed on the semiconductor substrate 102. In some embodiments, the substrate electrodes 108 may include metal gates of transistors formed in the device layer of the semiconductor substrate 102.

The interconnect structure 110 may be formed of any suitable electrically conductive material, such as copper (Cu), a copper alloy, aluminum (Al), an aluminum alloy, silver (Ag), combinations thereof, or the like. For example, the interconnect structure 110 may preferably include copper at an atomic percentage greater than 80%, such as greater than 90% and/or greater than 95%, although greater or lesser percentages of copper may be used. Other suitable electrically conductive materials are within the contemplated scope of disclosure.

In some embodiments, barrier layers (not shown) may be disposed between the metal features 106 and the dielectric layers of the dielectric structure 104, to prevent the material of the metal features 106 from migrating to the semiconductor substrate 102. The barrier layer may include Ta, TaN, Ti, TiN, CoW, or combinations thereof, for example. Other suitable barrier layer materials may be within the contemplated scope of disclosure.

The seal ring 130 may extend around the periphery of the die 10. For example, the seal ring 130 may be disposed in the dielectric structure 104 and may laterally surround the interconnect structure 110. The seal ring 130 may be configured to protect the interconnect structure 110 from contaminant diffusion and/or physical damage during device processing, such as plasma etching and/or deposition processes.

The seal ring 130 may include copper at an atomic percentage greater than 80%, such as greater than 90% and/or greater than 95% although greater or lesser percentages may be used. The seal ring 130 may include conductive lines and via structures that are connected to each other and may be formed simultaneously with the conductive lines and via structures of the metal features 106 of the interconnect structure 110. The seal ring 130 may be electrically isolated from the metal features 106. Other suitable seal ring materials may be within the contemplated scope of disclosure.

In some embodiments, the metal features 106 and/or the seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the metal features 106 and/or the seal ring 130 may be formed by an electroplating process.

For example, the Damascene processes may include patterning the dielectric structure 104 to form openings, such as trenches and/or through-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the dielectric structure 104.

In particular, the patterning, metal deposition, and planarizing processes may be performed for each of the ILD layers 104B-104F, in order to form the interconnect structure 110 and/or the seal ring 130. For example, an ILD layer 104B may be deposited and patterned to form openings in the ILD layer. A deposition process may then be performed to fill the openings in the ILD layer 104B. A planarization process may then be performed to remove the overburden and form metal features 106 in the ILD layer 104B. These process steps may be repeated to form the ILD layers 104C-104F and the corresponding metal features 106, and thereby complete the interconnect structure 110 and/or seal ring 130.

A bonding layer 150 may be disposed over the dielectric structure 104. The bonding layer 150 may be formed of a dielectric material. The bonding layer 150 may be formed by depositing a dielectric material, such as silicon oxide, silicon nitride, a polymer, or a combination thereof, using any suitable deposition process. Other suitable dielectric materials may be within the contemplated scope of disclosure. The bonding layer 150 may include bonding pads 152, which may be made of an electrically conductive metal. For example, the bonding pads 152 may include tungsten (W), copper (Cu), a copper alloy, aluminum (Al), an aluminum alloy, or a combination thereof, or the like.

An upper metal ring 352 may be formed in the bonding layer 150. The upper metal ring 352 may be disposed in a bonding trench formed in the bonding layer 150. In some embodiments, the upper metal ring 352 may alternatively or additionally be formed on the bottom of the semiconductor substrate 102. For example, the upper metal ring 352 may be formed in a bonding layer 153 disposed on the bottom of semiconductor layer 102. The upper metal ring 352 may be referred to as an upper metal ring 352 as it may be formed in a bonding layer 153 disposed on the bottom of a semiconductor layer 102 of an upper semiconductor die 10 that may be subsequently placed over and fusion and/or hybrid bonded to a lower semiconductor die 200.

Preferably, the upper metal ring 352 may be formed of a low melting point metal such as tin, lead, copper, or a copper alloy. Preferably, the upper metal ring 352 may include copper at an atomic percentage greater than 80%, such as greater than 90% and/or greater than 95%, although greater or lesser percentages of copper may be used. However, the present disclosure is not limited to any particular material. The upper metal ring 352 may be formed by a dual-Damascene process, or by one or more single-Damascene processes, as described above. In alternative embodiments, the upper metal ring 352 may be formed by an electroplating process.

In some embodiments, the die 10 may optionally include upper metal lines 356 formed in the bonding layer 150 or in the alternative bonding layer 153. The upper metal lines 356 may be formed of the same material as the upper metal ring 352 and/or by the same deposition process.

The TSV structure 162 may extend through a trench formed in the semiconductor substrate 102. The TSV structure 162 may be formed during a middle-end-of-line (MEOL) process, and may be formed of suitable electrically conductive material, such as, copper (Cu), a copper alloy, aluminum (Al), an aluminum alloy, silver (Ag), tungsten (W), combinations thereof, or the like. For example, the TSV structure 162 may preferably include copper at an atomic percentage greater than 80%, such as greater than 90% and/or greater than 95%, although greater or lesser percentages of copper may be used.

In some embodiments, a barrier layer may be disposed between the TSV structure 162 and the semiconductor substrate 102 and the dielectric structure 104. The barrier layer may include Ta, TaN, Ti, TiN, CoW, or combinations thereof, for example. Other suitable barrier layer materials may be within the contemplated scope of disclosure.

Referring to FIG. 1B, the interposer 20 may be a multilayer structure including a substrate 225, such as a silicon substrate, at least one redistribution layer 224, and a protective layer 226, and a bonding layer 228. In some embodiments, the interposer 20 may be configured to be mounted to a supporting substrate, such as a printed circuit board (PCB). Electrical connections between the supporting substrate (e.g., a PCB) and the interposer 20 may be made via the redistribution structures 224 within the interposer 20. Other suitable configurations for the interposer 20 are within the contemplated scope of disclosure.

For example, the interposer 20 may include a pair of redistribution layers 224 located above and below the substrate 225. The substrate 225 may be a plate-like member composed of a suitable material other than silicon, such as an epoxy resin, glass, and/or ceramic material. The substrate 225 may include a plurality of conductive via structures 230 extending through the substrate 225. The redistribution layers 224 may include metal features 227, such as metal lines, via structures, and bonding regions, embedded in a dielectric material matrix. In some embodiments, the dielectric material matrix may include multiple layers of a dielectric material, such as a photosensitive epoxy material. Each layer of dielectric material may be lithographically patterned to form open regions (e.g., trenches and via openings) within the respective layers of dielectric material. A metallization process may be used to fill the open regions with a suitable conductive material, such as copper or a copper-alloy, within each layer of dielectric material to form the metal features 227 embedded within the dielectric material matrix.

The protective layer 226 and the bonding layer 228 may be formed over the respective redistribution layers 224. The protective layer 226 and the bonding layer 228 may include bonding pads 252, which may be made of an electrically conductive metal such as copper, a copper alloy, or the like. In some embodiments, the protective layer 226 may include a layer of solder resist material, which may operate as a protective coating for the interposer 20 and the underlying metal features 227.

The bonding layer 228 may be formed by depositing a dielectric material, such as silicon oxide, silicon nitride, a polymer, or a combination thereof, using any suitable deposition process. Other suitable dielectric materials may be within the contemplated scope of disclosure.

At least a portion of a lower metal ring 354 may be formed in the bonding layer 228. In some embodiments, the lower metal ring 354 may be disposed in a channel formed in the bonding layer 228. The lower metal ring 354 may be formed of a low melting point metal such as tin, lead, copper, or a copper alloy. However, the present disclosure is not limited to any particular material. The lower metal ring 354 may preferably include copper at an atomic percentage greater than 80%, such as greater than 90% and/or greater than 95%, although greater or lesser percentages of copper may be used. The lower metal ring 354 may be formed by a dual-Damascene processes, or by one or more single-Damascene processes, as described above. In alternative embodiments, the lower metal ring 354 may be formed by an electroplating process.

In some embodiments, the interposer 20 may optionally include a lower metal line 358 disposed in the bonding layer 228. The lower metal line 358 may be formed by the same process and of the same material as the lower metal ring 354.

Referring to FIGS. 1A and 1B, it is noted that the bonding layer 152 of die 10 includes two sections of the upper metal ring 352 and two sections of upper metal lines 356, while the interposer 20 includes only one section of the lower metal ring 354 and one section of the lower metal line 358. This is due to the upper die 10 being configured as a cross die designed to be bonded to at least two interposers 20 (e.g., bottom dies), while the interposer 20 is configured to bond with one cross die. However, the interposer 20 could include additional bottom metal ring and bottom metal line segments for bonding to additional cross dies.

Figures 2A, 2B:
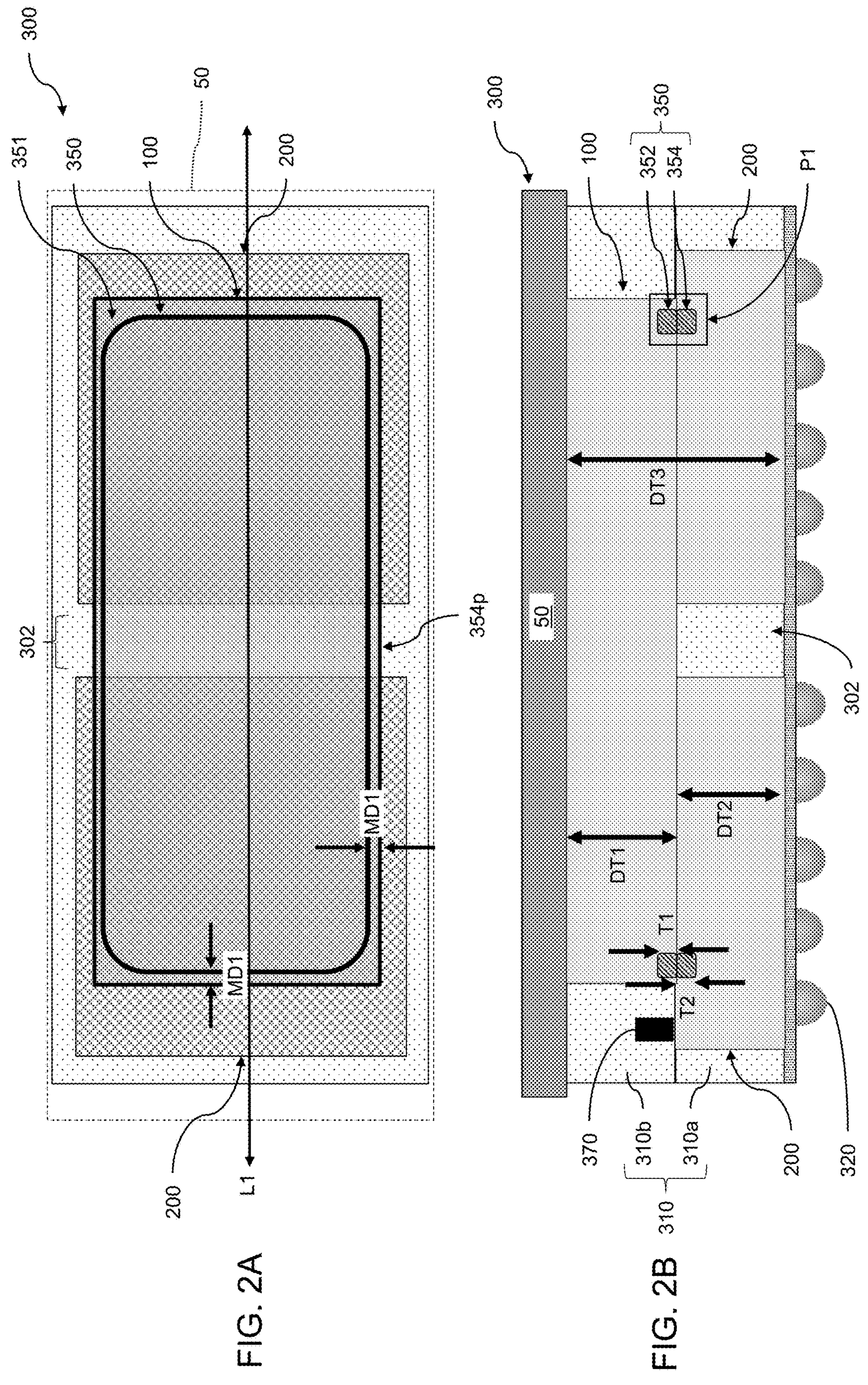
FIG. 2A is a top view of a multi-level, multi-die semiconductor device, according to various embodiments of the present disclosure.
FIG. 2B is a cross-sectional view taken through line L1 of FIG. 2A.
Figure 2C:
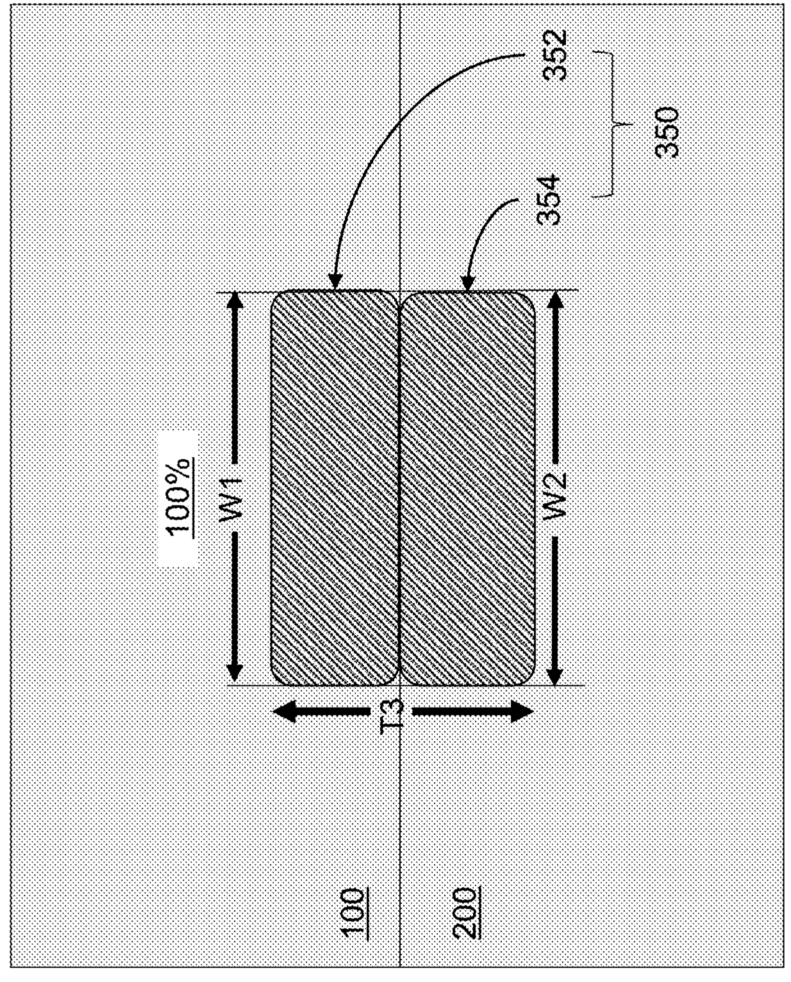
FIG. 2C is an enlarged view of a portion P1 of FIG. 2B.

FIG. 2A is a top view of a semiconductor device 300, according to various embodiments of the present disclosure. FIG. 2B is a cross-sectional view taken through line L1 of FIG. 2A. FIG. 2C is an enlarged view of a portion P1 of FIG. 2B. Referring to FIGS. 2A-2C, the semiconductor device 300 may include at least one cross die 100 vertically stacked on and bonded to at least two lower dies 200. The cross die 100 may be disposed on a carrier 50, in some embodiments. In some embodiments, the semiconductor device 300 may include multiple dies stacked on and bonded to the cross die 100.

The semiconductor device 300 may include a molding structure 310 that surrounds the cross die 100 and the lower dies 200. The molding structure 310 may be a dielectric material, such as a metal oxide, such as silicon oxide, silicon nitride, silicon oxynitride, etc., a polymer material, a molding material, a resin, or the like. The molding structure 310 may include a lower dielectric layer 310*a* and an upper dielectric layer 310*b*. The lower dielectric layer 310 may laterally surround the lower dies 200 (e.g., may contact side surfaces of the lower dies 200) and may fill a die gap 302 that separates the lower dies 200. As such, the die gap 302 may be referred to as a dielectric region 302. The upper dielectric layer 310*b* may laterally surround the cross die 100 and cover at least a portion of the lower dies 200.

In some embodiments, the semiconductor device 300 may include solder bumps on the bottom of the lower dies 200. The solder bumps 320 may be micro bumps formed of a solder material, such as tin, lead, alloys thereof, or the like, and may be configured to electrically connect the semiconductor device to other components, such as a PCB or the like.

In some embodiments, the semiconductor device 300 may include one or more passive components 370 disposed within the molding structure 310. The passive components 370 may include transistors, fuses, resistors, inductors, or the like, which may be electrically connected to any of the lower dies 200 and/or the cross die 100.

The cross die 100 and/or the lower dies 200 may each be an active die or a passive die. For example, active dies, such as a memory chip, a logic chip, an analog chip, a radio frequency chip, an integrated passive device chip, or the like. For example, the cross die 100 may be a semiconductor die 10 as shown in FIG. 1A. Passive dies may be non-computational dies configured to relay signals generated by one or more active dies. For example, passive dies may include interposers, dummy dies, or the like. For example, in some embodiments, at least one of the lower dies 200 may be an interposer 20 as shown in FIG. 1B.

The semiconductor device 300 may include a bonding ring 350 configured to strengthen the bonding of the cross die 100 to the lower dies 200. The bonding ring 350 may be continuous or discontinuous mark, line, ring, or circuit formed in the semiconductor device 300. The bonding ring 350 may be formed by bonding an upper metal ring 352 of the cross die 100 and a lower metal ring 354 of the lower dies 200. For example, the upper metal ring 352 may be formed in a lower surface of the cross die 100, and the lower metal ring 354 formed in upper surfaces of the lower dies 200. Portions 354*p* of the lower metal ring 354 may be formed in the molding structure 310 (e.g., lower dielectric layer 310*a*) and may extend across the dielectric region 302, adjacent to corresponding portions of the upper metal ring 352.

With respect to a vertical direction (e.g., a stacking direction of the cross die 100 and the lower dies 200), the upper metal ring 352 may have a first line thickness T1, the lower metal ring 354 may have a second line thickness T2, the cross die 100 may have a first die thickness DT1, and the lower dies 200 may have a second die thickness DT2. The first line thickness T1 may be at least 10% of the first die thickness DT1, and the second line thickness T2 may be at least 10% of the first die thickness DT1 or the second die thickness DT2. For example, in some embodiments the first line thickness T1 and the second line thickness T2 may each be ≥100 Å. For example, the first line thickness T1 and the second line thickness T2 may range from about 100 Å to about 1000 Å. In various embodiments, the first die thickness DT1 and the second die thickness DT2 may be the same or different, and the first line thickness T1 and the second line thickness T2 may also be the substantially the same thickness. In other embodiments, the first line thickness T1 and the second line thickness T2 may be different thicknesses. In various embodiments, a total line thickness T3 (T1+T2) may be at least 10% of a total die thickness DT3 (DT1+DT2).

With respect to a horizontal direction perpendicular to the vertical direction, the upper metal ring 352 may have a first width W1 and the lower metal ring 354 may have a second width W2. The first width W1 and/or the second width W2 may be ≥100 Å, such as ≥250 Å, and in some embodiments may range from 0.5 μm to 100 μm, such as from 1 μm to about 40 μm. In various embodiments, the first width W1 and/or the second width W2 may be greater than 25% of the first die thickness DT1. In some embodiments the first width W1 may be greater than the second width W2. In other embodiments, the second width W2 may be greater than the first width W1. In still other embodiments, the first width W1 and the second width W2 may be approximately the same.

In a plan view, the bonding ring 350 may have a generally rectangular structure with rounded corners 351. In a plan view, the bonding ring 350 may be disclosed to be in close proximity to the peripheral edges of the cross die 100, in order to provide improved bonding strength in areas where high bond stress typically occurs. For example, a minimum distance MD1 between linear portions of the bonding ring 350 and an edge of the cross die 100, taken in a horizontal direction perpendicular to the vertical stacking direction, may range from 0>μm to 30 μm, such as from 1 μm to 20 μm, from 2 μm to 15 μm, or from 3 μm to 10 μm. For example, the minimum distance may be 0.5 μm, 1 μm, 3 μm, 5 μm, 8 μm 10 μm, 12 μm, 15 μm, 17 μm, or 20 μm. Herein, a "minimum distance" refers to the shortest distance between two points.

In some embodiments, the rounded corners 351 of the bonding ring 350 may be disposed more than the minimum distance MD1 from the edges of the cross die 100. In particular, locating the corner portions of the bonding ring 350 further from the corners of the cross die 100 may reduce the accumulation of bond stress under the corners of the cross die 100.

FIGS. 3A-3E are vertical cross-sectional views of alternative configurations having different size and overlap configurations of the upper metal ring 352 and the lower metal ring 354 of FIGS. 2A and 2B. FIGS. 3G and 3H are top-down views of different size configurations of the upper metal ring 352 and the lower metal ring 354 of FIGS. 2A and 2B.

Figure 3A:
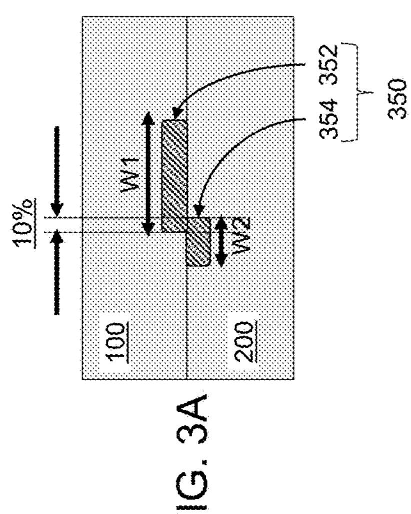
FIGS. 3A-3F are vertical cross-sectional views of alternative configurations having different size and overlap configurations of the upper metal ring and the lower metal ring of FIGS. 2A and 2B.
Figure 3B:
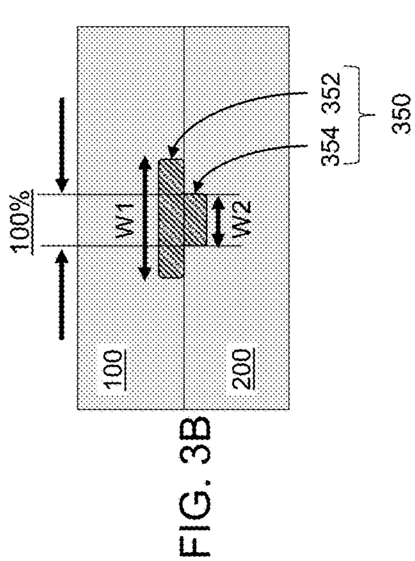
Figure 3C:
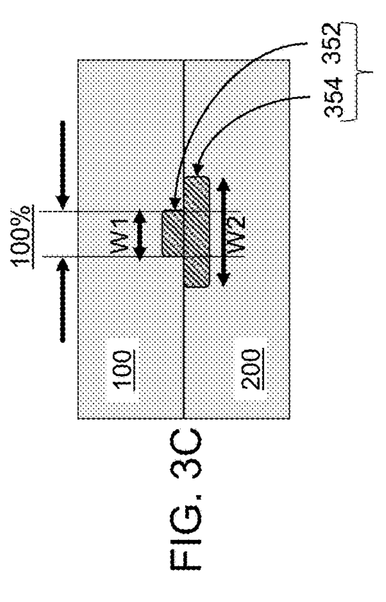
Figure 3D:
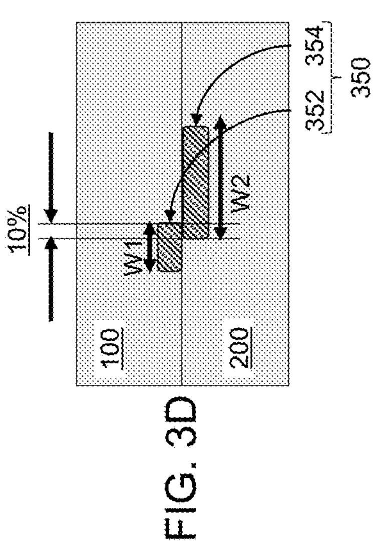
Figure 3E:
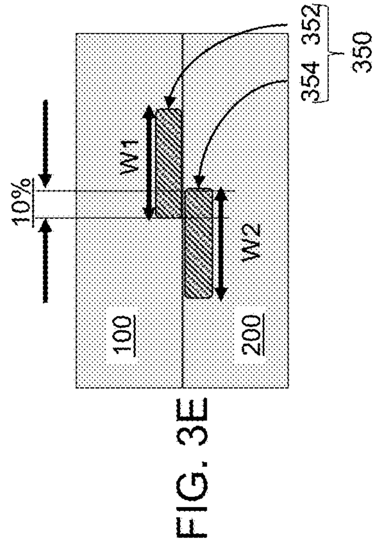
Figure 3F:
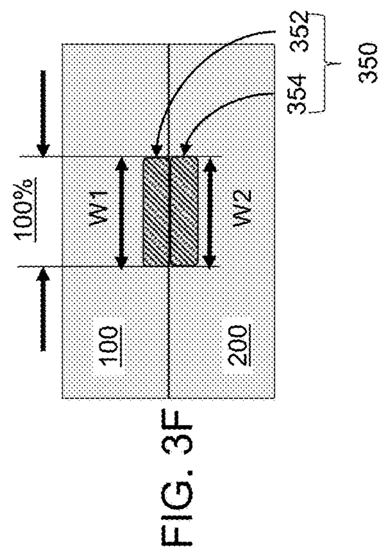
Figure 3G:
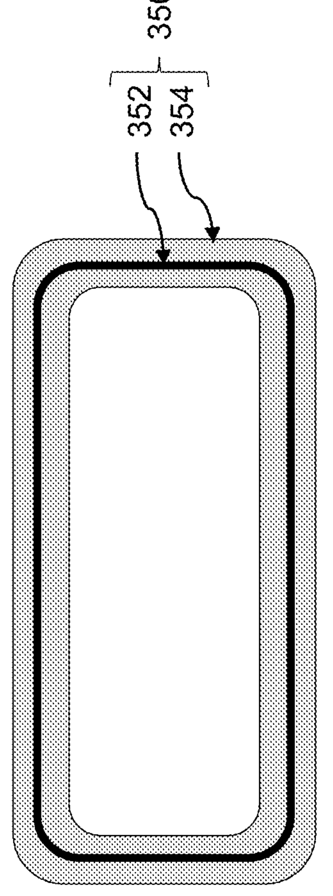
FIGS. 3G and 3H are top views of different size configurations of the upper metal ring and the lower metal ring of FIGS. 2A and 2B.
Figure 3H:
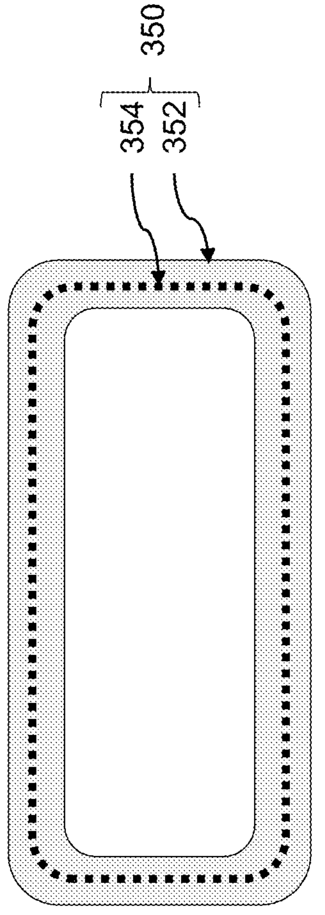

Referring to FIGS. 3A-3F, with respect to a horizontal direction perpendicular to the vertical direction, the upper metal ring 352 may have a first width W1 and the lower metal ring 352 may have a second width W2. The first width W1 and/or the second width W2 may be greater than ≥100 Å such as ≥250 Å, and in some embodiments may each be in a range from 0.05 μm to 100 μm, such as from 1 μm to 40 μm. In various embodiments, the first width W1 and/or the second width W2 may be greater than 25% of the first die thickness DT1 (see, FIG. 2B). In some embodiments the first width W1 may be greater than the second width W2, as shown in FIGS. 3A and 3B. In other embodiments, the second width W2 may be greater than the first width W1, as shown in FIGS. 3C and 3D. In other embodiments, the first width W1 and the second width W2 may be approximately the same, as shown in FIGS. 3E and 3F. In other words, the surface area of the upper metal ring 352 may be greater than the surface area of the lower metal ring 354, the surface area of the lower metal ring 354 may be greater than the surface area of the upper metal ring 352, or the surface areas of the upper metal ring 352 and the lower metal ring 354 may be approximately the same.

An amount of vertical overlap between the upper metal ring 352 and the lower metal ring 354 may be at least 10% of the area of the smaller of the upper metal ring 352 and the lower metal ring 354. For example, as shown in FIG. 3A, a larger upper metal ring 352 may overlap with at least 10% of the area of a smaller lower metal ring 354. As shown in FIG. 3B, a larger upper metal ring 352 may overlap with 100% of the area of a smaller lower metal ring 354. As shown in FIG. 3C, a larger lower metal ring 354 may overlap with 100% of the area of a smaller upper metal ring 352. As shown in FIG. 3D, a larger lower metal ring 354 may overlap with 10% of the area of a smaller upper metal ring 352. As shown in FIG. 3E, an upper metal ring 352 and the lower metal ring 354 having the same width may have an area overlap of at least 10%. As shown in FIG. 3F, an upper metal ring 352 and the lower metal ring 354 having the same width may have an area overlap of 100%.

As shown in FIG. 3G, the lower metal ring 354 may have a larger surface area than the upper metal ring 352. The bottom surface of the upper metal ring 352 may contact at least 10% such as at least 25%, or at least 50% of a top surface of the lower metal ring 354. For example, the bottom surface of the upper metal ring 352 may contact from 10% to 100%, such as from 20% to 90%, from 30% to 80%, from 40% to 70%, or from 50% to 60%, of the top surface of the lower metal ring 354.

As shown in FIG. 3H, the upper metal ring 352 may have a larger area than the lower metal ring 354. The top surface of the lower metal ring 354 may contact at least 10%, such as at least 25%, or at least 50% of the bottom surface of the upper metal ring 352. For example, the top surface of the lower metal ring 354 may contact from 10% to 100%, such as from 20% to 90%, from 30% to 80%, from 40% to 70%, or from 50% to 60%, of the bottom surface of the upper metal ring 352.

FIG. 4A-4D are top-down views of the semiconductor device 300, showing possible horizontal offsets of the upper metal ring 352 and the lower metal ring 354, according to various embodiments of the present disclosure. The various offsets may be due to misalignments of the cross die 100 over the lower dies 200 during a pick and place operation.

Figure 4B:
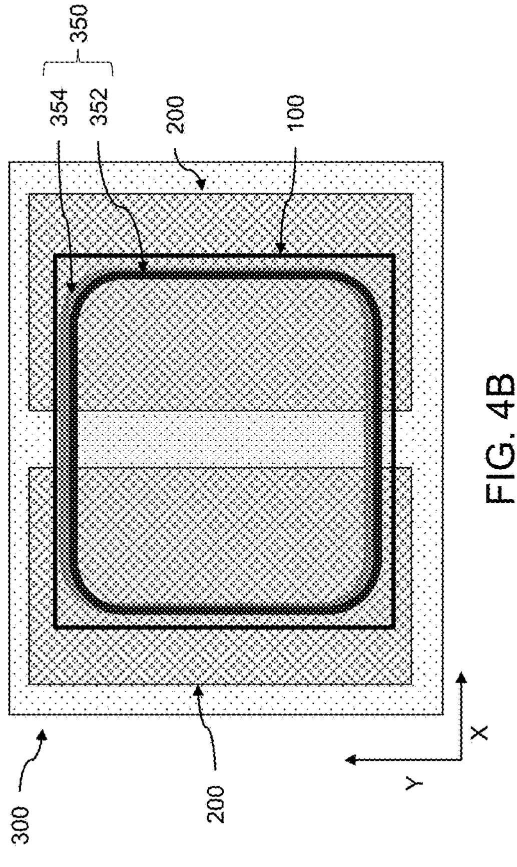
FIG. 4A-4D are top views of the semiconductor device of FIGS. 2A and 2B, showing possible horizontal offsets of the upper metal ring and the lower metal ring, according to various embodiments of the present disclosure.
Figure 4A:
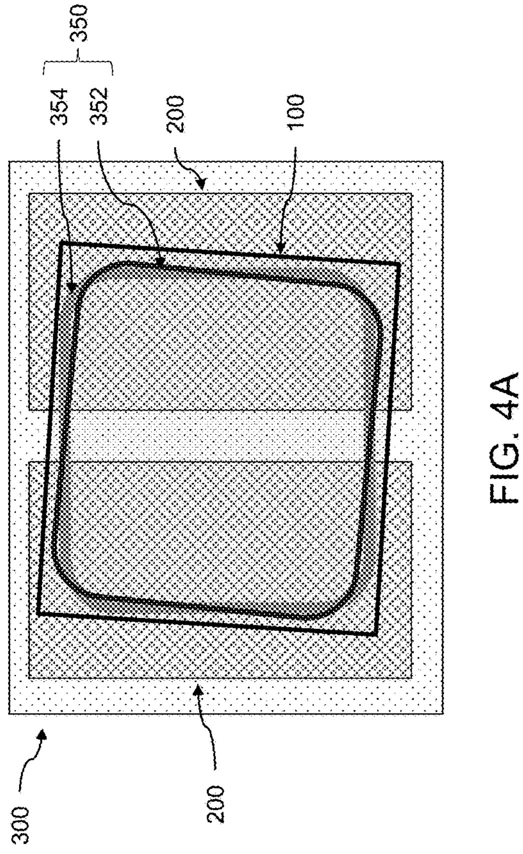
Figure 4D:
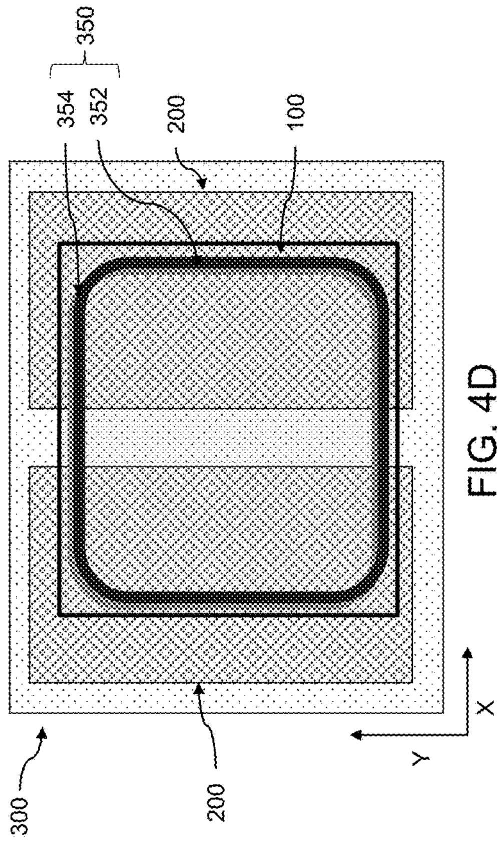
Figure 4C:
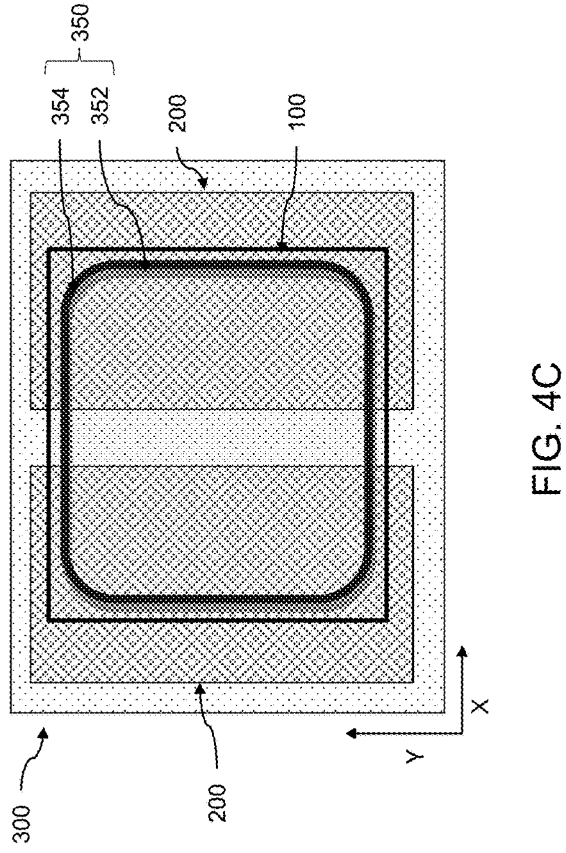

During manufacturing, die misalignment may occur. For example, as shown in FIG. 4A, the cross die 100 may be rotated with respect to an ideal position on the lower dies 200. As shown in FIG. 4B the cross die 100 may be misaligned in a Y direction with respect to an ideal position on the lower dies 200. As shown in FIG. 4C, the cross die

100 may be misaligned in an X direction with respect to an ideal position on the lower dies 200. As shown in FIG. 4D, the cross die 100 may be misaligned in both X and Y directions with respect to an ideal position on the lower dies 200 such that the cross die is diagonally misaligned.

The various embodiments disclosed herein may allow for a misalignment of the various cross dies 100 and lower dies 200 by providing a bonding ring 350 that may be configured to provide sufficient overlap surface area between the upper metal ring 352 and the lower metal ring 354. Thus, despite the upper metal ring 352 being not precisely aligned with the lower metal ring 354, the widths of the upper metal ring 352 and the lower metal ring 354 may be designed to provide a minimum overlap area of at least 10%, even when die misalignment occurs as shown in FIGS. 4A-4D. In this manner, for example, the widths of the upper metal ring 352 and/or lower metal ring 354 may be designed to provide a sufficient bonding area and corresponding bonding strength, even if a typical amount die misalignment occurs.

Figures 5A, 5B:
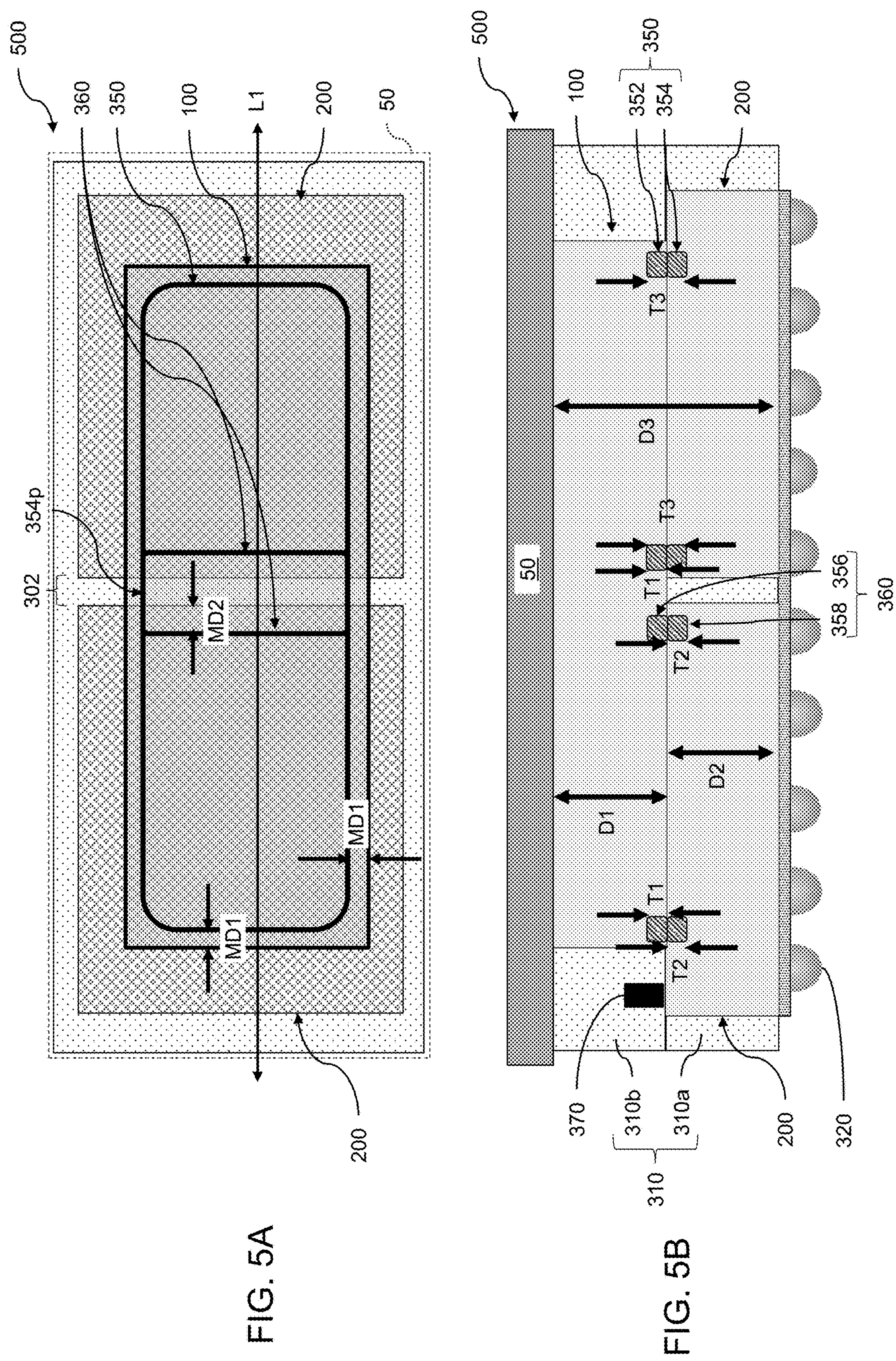
FIG. 5A is a top view of a semiconductor device, according to various embodiments of the present disclosure.
FIG. 5B is a cross-sectional view taken through Line L1 of FIG. 5A.

FIG. 5A is a top view of a semiconductor device 500, according to various embodiments of the present disclosure. FIG. 5B is a cross-sectional view taken through line L1 of FIG. 5A. The semiconductor device 500 may be similar to the semiconductor device 300. As such, only the differences therebetween will be discussed in detail.

Referring to FIGS. 5A and 5B the semiconductor device 500 may include a bonding ring 350 and bonding lines 360. The bonding ring 350 and the bonding lines 360 may each be a continuous or discontinuous metal element formed in the semiconductor device 300. In plan view, the bonding ring 350 may be a rectangular ring having rounded corners and that extends along at least a portion of the perimeter of the cross die 100. The bonding lines 360 may be disposed within the bonding ring 350 and may extend along edges of the lower dies 200 adjacent to the dielectric region 302.

The bonding ring 350 may be formed by bonding the upper metal ring 352 and the lower metal ring 354. The bonding lines 360 may be formed by bonding upper metal lines 356 formed in the cross die 100 and lower metal lines 358 formed in the lower dies 200. The bonding lines 360 provide additional structures for the cross die 100 to bond to the lower dies 200 to produce stronger bonds and additional points of alignment.

According to various embodiments, portions of the bonding ring 350 and/or the bonding lines 360 may be disposed adjacent to one or more edges of the cross die 100 and/or one or more edges of the lower dies 200, in order to provide increased bonding along die edges, where the highest amounts of bond stress typically occur. For example, linear portions of the bonding ring 350 may be disposed a minimum distance MD1, taken in a horizontal direction perpendicular to a vertical stacking direction of the cross die 100 and the lower dies 200, from corresponding edges of the cross die 100. In addition, the bonding lines 360 may be disposed within a minimum distance MD2 from corresponding edges of the lower dies 200, which may be the edge of the dielectric region 302. The minimum distances MD1 and MD2 may be the same or different and may range from 0>μm to 30 μm, such as from 1 μm to 20 μm, from 2 μm to 15 μm, or from 3 μm to 10 μm. For example, the minimum distance may be 0.5 μm, 1 μm, 3 μm, 5 μm, 8 μm 10 μm, 12 μm, 15 μm, 17 μm, or 20 μm.

The dimensions and overlap amounts of the upper metal rings 352, the lower metal rings 354, the upper metal lines 356, and the lower metal lines 358 may be as discussed above with respect to FIGS. 2A-2C. The die thicknesses D1, D2, and D3 may also be as discussed above.

FIGS. 6A-6D are top-down views of semiconductor devices 600*a*-600*d*, according to various embodiments of the present disclosure. The semiconductor devices 600*a*-600*d* may be similar to the semiconductor device 300. As such, only the differences therebetween will be discussed in detail.

Figure 6B:
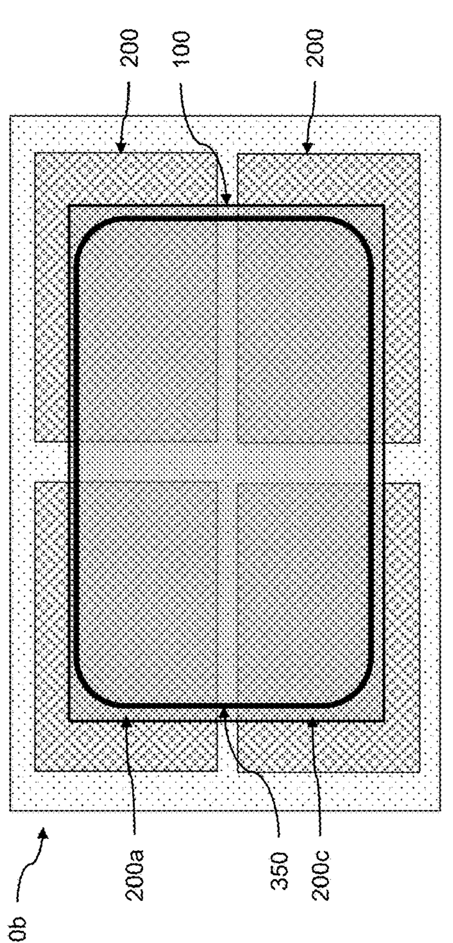
FIGS. 6A-6D are top views of semiconductor devices with alternative metal ring configurations, according to various embodiments of the present disclosure.
Figure 6A:
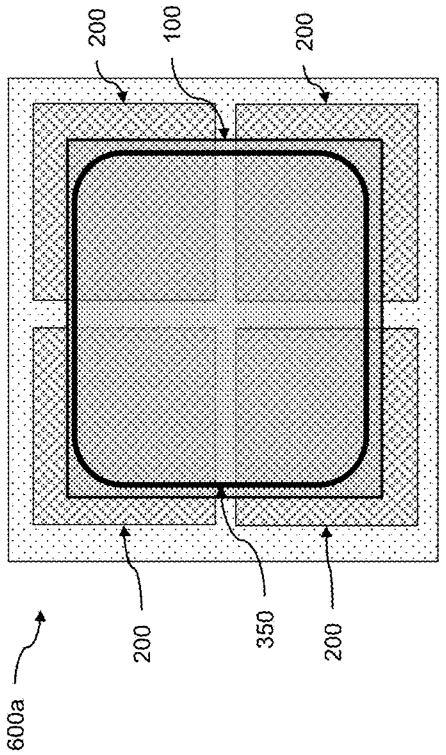
Figure 6D:
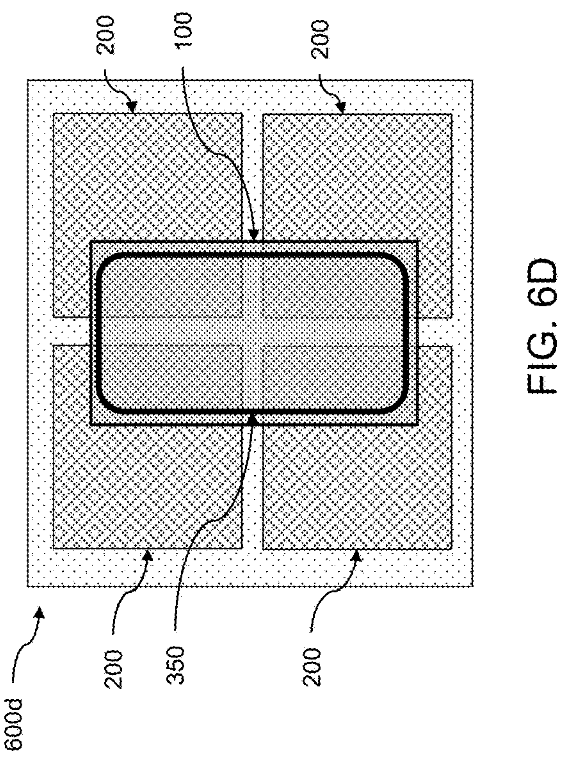

Referring to FIG. 6A, the semiconductor device 600*a* may include a square cross die 100 disposed on four square lower dies 200. The cross die 100 may be centered on the lower dies 200. In some embodiments, the lower dies 200 may be the same size and shape.

Referring to FIG. 6B, the semiconductor device 600*b* may include a rectangular cross die 100 disposed on four rectangular lower dies 200. The cross die 100 may be centered on the lower dies 200. As shown in FIG. 6B, the lower dies 200 may be the same size.

Figure 6C:
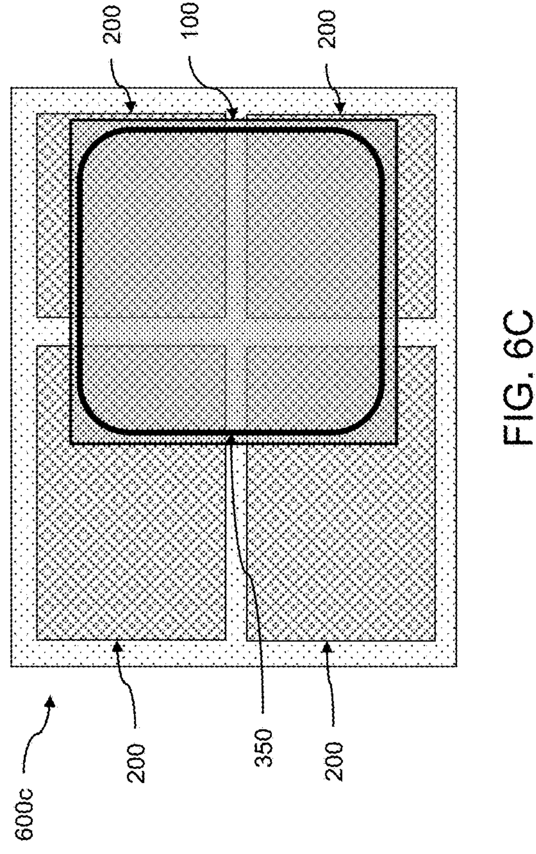

Referring to FIG. 6C, the semiconductor device 600*c* may include a square cross die 100 disposed on four rectangular lower dies 200. The cross die 100 may be disposed off-center (e.g., offset) with respect to the lower dies 200. The lower dies 200 may have different sizes. As such, the cross die 100 may be securely bonded to the lower dies 200 having a variety of shapes, Referring to FIG. 6D, the semiconductor device 600*d* may include a rectangular cross die 100 disposed on four square lower dies 200. The cross die 100 may be centered with respect to the lower dies 200. The lower dies 200 may be the same size.

Accordingly, as shown in FIGS. 6A-6D, a cross die 100 may be disposed on base dies 200 having various configurations. For example, the cross die 100 may be centered on one or more of the lower dies 200 and/or may be offset with respect to one or more lower dies 200. In addition, bonding rings 350 may be designed to securely bond a cross die 100 to corresponding lower dies 200. In particular, bonding rings 350 may be configured to increase bonding strength at edge regions of a cross die 100. In various embodiments, the shape and size of the cross die 100 may influence the shape and size of the bonding ring. The location of the bonding ring 350 may be determined by the edge of the cross die. Thus, for example, the shape and size and placement of the cross die 100 may determine where a bonding ring 350 is located. In some embodiments, as shown in FIG. 6C, the bonding ring 350 may be offset from the position of the lower dies 200. In some embodiments, the cross die 100 may be offset from the lower dies 200 by any distance so long as the guidelines of metal ring connection area and minimum distance to cross die edge are followed.

FIGS. 7A-7E are top views of semiconductor devices 700*a*-700*e*, according to various embodiments of the present disclosure. The semiconductor devices 700*a*-700*e* may be similar to the semiconductor device 300. As such, only the differences therebetween will be discussed in detail.

Figures 7A, 7B, 7C:
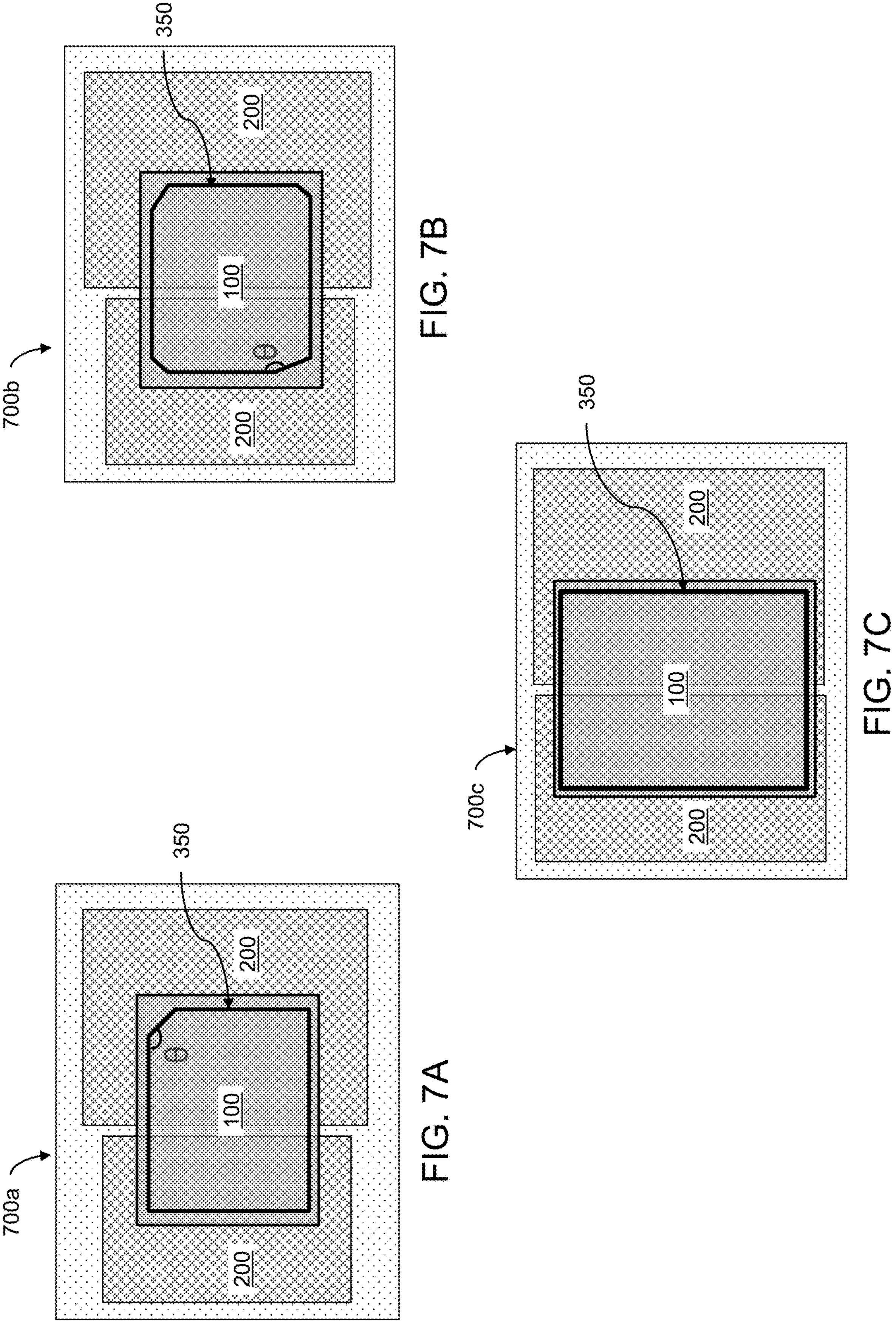
FIGS. 7A-7E are top views of semiconductor devices with alternative metal ring configurations, according to various embodiments of the present disclosure.

Referring to FIG. 7A, the semiconductor device 700*a* may include a cross die 100 disposed on two lower dies 200. The cross die 100 may include a pentagonal bonding ring 350. Internal angles of the bonding ring 350 may range from less than 180° to 90°. At least one internal, such as internal angle θ may range from less than 180° to greater than 90°). The lower dies 200 may have the same or different sizes and/or shapes.

Referring to FIG. 7B, the semiconductor device 700*b* may include a cross die 100 disposed on two lower dies 200. The cross die 100 may include an octagonal bonding ring 350. Internal angles of the bonding ring 350, such as internal angle θ, may range from less than 180° to greater than 90°. The lower dies 200 may have the same or different sizes and/or shapes.

Referring to FIG. 7C, the semiconductor device 700*c* may include a cross die 100 disposed on two lower dies 200. The cross die 100 may include a rectangular bonding ring 350. Internal angles of the bonding ring 350 may be 90°. The lower dies 200 may have the same or different sizes and/or shapes.

Figure 7E:
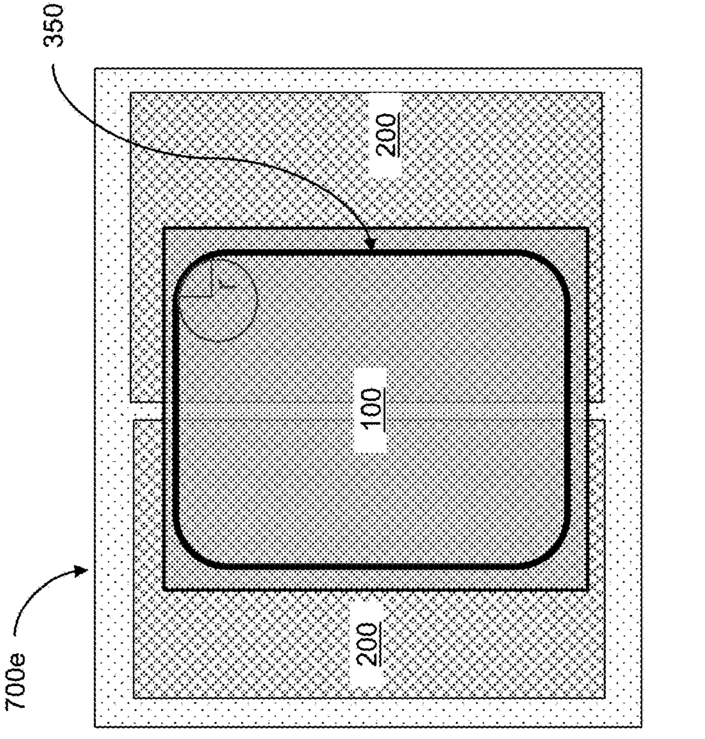
Figure 7D:
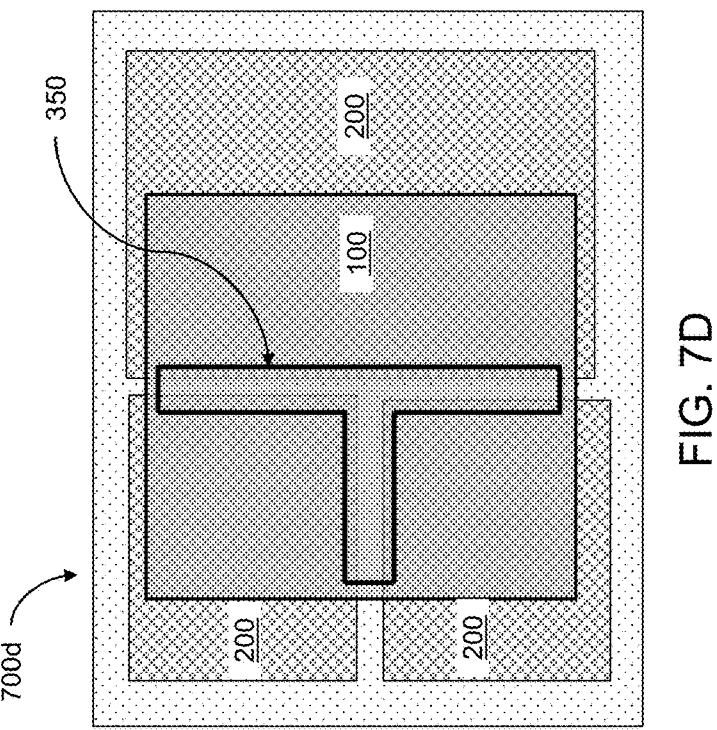

Referring to FIG. 7D, the semiconductor device 700*d* may include a cross die 100 disposed on three lower dies 200. The cross die 100 may include a polygonal bonding ring 350. Internal angles of the bonding ring 350 may be 90°, for example. The lower dies 200 may have different sizes and/or shapes. The bonding ring 350 may extend along gaps between the lower dies 200 in order to provide increased bonding strength adjacent to gaps between the dies 200, where high bond stress and/or weak bonding typically occurs.

Referring to FIG. 7E, the semiconductor device 700*e* may include a cross die 100 disposed on two lower dies 200. The cross die 100 may include a rectangular bonding ring 350 having rounded corners. The rounded corners may each have a radius of curvature r that is greater than 0 and less than half of the length of an adjacent shortest linear portion of the bonding ring 350. The lower dies 200 may have the same or different sizes and/or shapes.

The bonding ring shapes shown in FIGS. 7A-7E may provide a wide process window. For example, the shape of a bonding ring may be configured to allow the bonding ring to be routed around existing die elements, such as bonding pads, TSV structures, seal rings, or the like. In addition, bonding rings can be routed around areas that may impact a die edge pattern density, bonding ring deposition, or CMP thickness uniformity. In some embodiments, the bonding rings may be designed to provide secure bonding, even when a cross die 100 or a base die includes manufacturing defects, such as chipping or cracks, due to die dicing for example, by including a bonding ring that is routed around damaged areas. Thus, the various angles and shapes of the bonding ring 350 shown in FIGS. 7A-7E may be formed to avoid manufacturing defects so as to ensure stable bonding connections between the cross die 100 and the lower dies 200.

FIGS. 8A-8D are top views of semiconductor devices 800*a*-800*d*, according to various embodiments of the present disclosure. The semiconductor devices 800*a*-800*d* may be similar to the semiconductor device 300. As such, only the differences therebetween will be discussed in detail. The semiconductor devices 800*a*-800*d* may include bonding rings and/or lines disposed at various locations where high bond stress may occur.

Figures 8A, 8B:
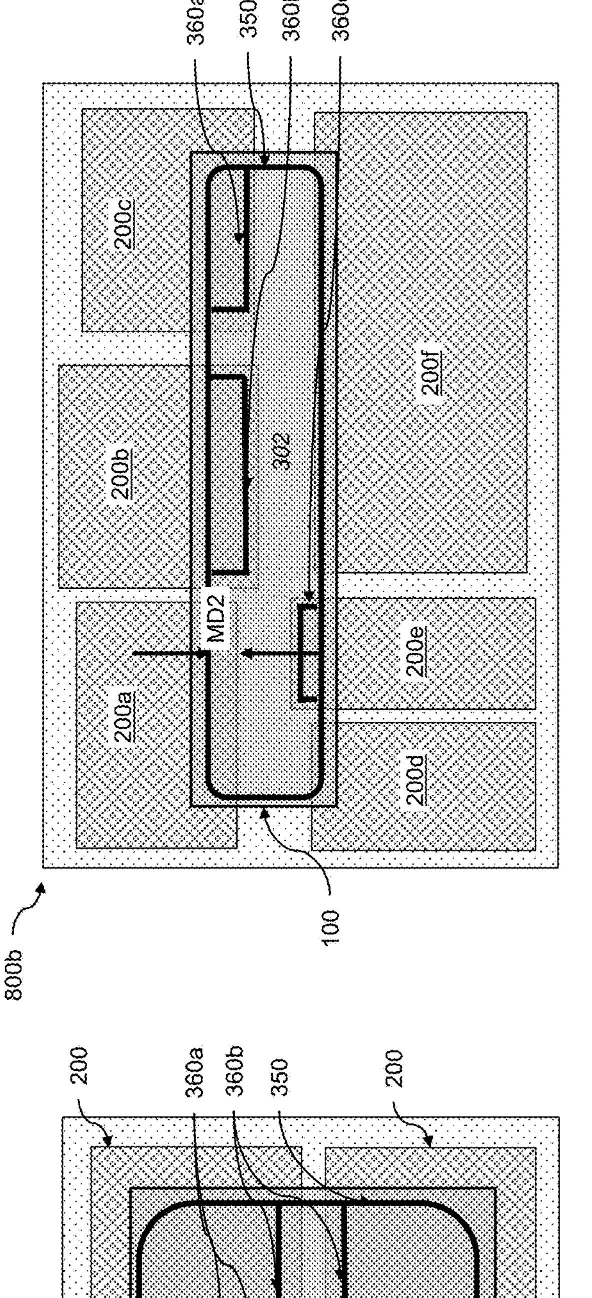
FIGS. 8A-8D are top views of semiconductor devices with alternative metal ring configurations, according to various embodiments of the present disclosure.

Referring to FIG. 8A, the semiconductor device 800*a* may include a cross die 100 disposed on four lower dies 200. The cross die 100 may include a rectangular bonding ring 350 having rounded corners, first bonding lines 360*a*, and second bonding lines 360*b*. The bonding ring 350 may extend along the perimeter of the cross die 100. The first bonding lines 360*a* may be lines that extend along opposing sides of a first portion 302*a* of a die gap, and the second bonding lines 360*b* may extend along opposing sides of a second portion 302*b* of the die gap. The first bonding lines 360*a* and the second bonding lines 360*b* may extend in perpendicular directions, in some embodiments.

Referring to FIG. 8B, the semiconductor device 800*b* may include a cross die 100 disposed on six lower dies 200*a*-200*f*. The cross die 100 may include a bonding ring 350, a first bonding line 360*a*, a second bonding line 360*b*, and a third bonding line 360*c*. The bonding ring 350 be a rectangular ring having rounded corners and that extends along the perimeter of the cross die 100. The first bonding line 360*a*, second bonding line 360*b*, and third bonding line 360*c* may extend along one or more edges of adjacent lower dies 200*b*, 200*c*, 200*e*. In particular, edges of the lower dies 200*b*, 200*c*, 200*e* that are overlapped by the cross die 100 may be further from corresponding edges of the cross die 100 than the overlapped edges of the lower dies 200*a*, 200*d*, 200*f*. As such, the first bonding line 360*a*, second bonding line 360*b*, and third bonding line 360*c* may provide increased bonding strength along corresponding portions of a dielectric region 302 formed between the lower dies 200. In particular, the first bonding line 360*a*, second bonding line 360*b*, and third bonding line 360*c* may be disposed over the lower dies 200*b*, 200*c*, 200*e* that have edges that are further than the minimum distance MD2 from the bonding ring 350, in order to improve bonding strength at edges of the lower dies 200*b*, 200*c*, 200*e*.

Figure 8D:
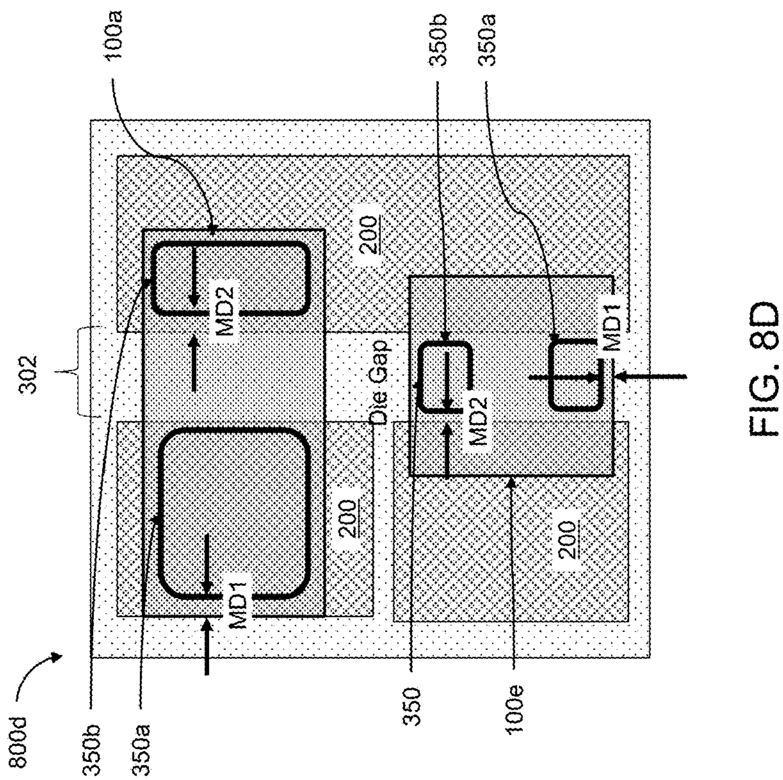
Figure 8C:
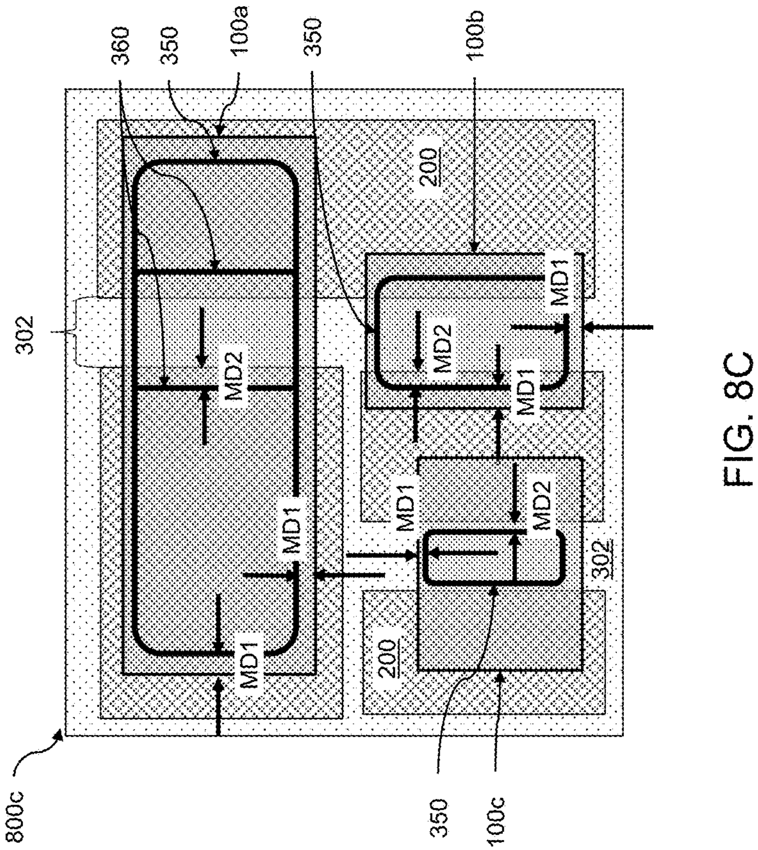

Referring to FIG. 8C, the semiconductor device 800*c* may include a cross die 100*a*, a second die 100*b*, and a third die 100*c* disposed on four lower dies 200. The cross die 100*a* may include a bonding ring 350 and bonding lines 360. The bonding ring 350 may be a rectangular ring having rounded corners and that that extends along the perimeter of the cross die 100. Linear segments of the bonding ring 350 may be disposed within the minimum distance MD1 of the edges of the cross die 100*a*.

The second die 100*b* may include a rectangular bonding ring 350 having rounded corners. Linear segments of the bonding ring 350 may be disposed within the minimum distance MD1 of the edges of the second die 100*b* and may also be disposed within the minimum distance MD2 of edges of the corresponding lower dies 200.

The third die 100*c* may include a rectangular bonding ring 350 having rounded corners. The bonding ring 350 may overlap vertically with a dielectric region 302. Linear segments of the bonding ring 350 may be disposed at the minimum distance MD1 of an edge of the third die 100*c* or may be disposed at the minimum distance MD2 of edges of the corresponding lower dies 200.

Referring to FIG. 8D, the semiconductor device 800*d* may include a cross die 100*a* and a second die 100*b* disposed on three lower dies 200. The cross die 100*a* may include a first bonding ring 350*a* and a second bonding ring 350*b*. The first and second bonding rings 350*a*, 350*b* rings may be disposed on opposing sides of a dielectric region 302. Linear segments of the first and second bonding rings 350*a*, 350*b* may be disposed within either the minimum distance MD1 of an edge of the cross die 100*a*, or within the minimum distance MD2 of an edge of a corresponding lower die 200.

The second die 100*b* may include a first bonding ring 350*a* and second bonding ring 350*b*, which may vertically overlap with the dielectric region 302. Linear segments of the first bonding ring 350*a* and the second bonding ring 350*b* may be disposed within either the minimum distance MD1 of an edge of the cross die 100*a* or within the minimum distance MD2 of an edge of a corresponding lower die 200.

Referring to FIGS. 8A-8D, a bonding ring may have various configurations and may be designed to increase bonding strength in areas where bonding issues typically occur, such as areas of high bonding stress and/or areas where the lowest bonding strength typically occurs, such as at edge regions of a cross die. For example, bonding rings may be flexibly designed to provide improved bonding strength in areas that are most likely to suffer from bonding stress and/or weak bonding, due to a die stacking structure, differences in die thickness, the area of a dielectric region, die metal density, or the like. In some embodiments, see e.g., FIG. 8D, the flexibility in bonding ring 350 shape, size and configuration, may locate the bonding ring 350 wholly within the die gap region. Such embodiments may improve cross die 100 to die gap bonding. In other embodiments the addition of bonding lines 360 in conjunction with bonding rings 350 may provide enhanced bonding between cross dies 100 and lower dies 200.

Figure 9B:
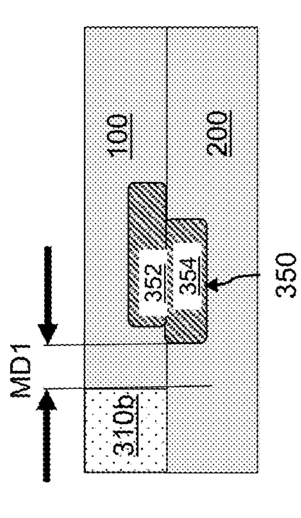
FIGS. 9A-9F are vertical cross-sectional views depicting alternative minimum distances MD1 and MD2, according to various embodiments of the present disclosure.
Figure 9D:
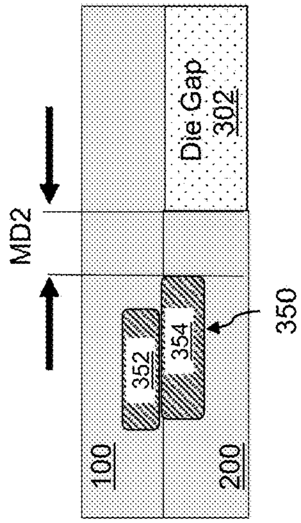
Figure 9F:
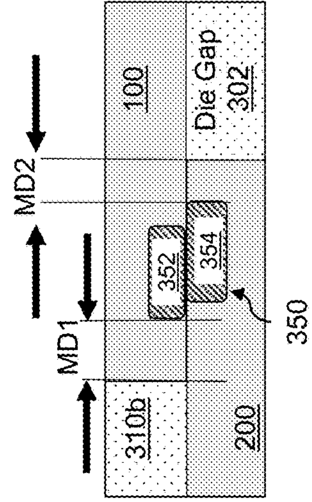
Figure 9A:
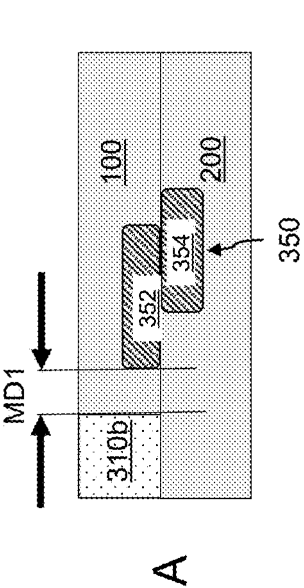

FIGS. 9A-9F are cross-sectional views showing how minimum distances MD1 and MD2 may be measured, according to various embodiments of the present disclosure. Referring to FIGS. 9A and 9B, minimum distance MD1 may be measured between the closest portion of the bonding ring 350 and the edge of the cross die 100. For example, minimum distance MD1 may be measured between the upper metal ring 352 and an adjacent edge of the cross die 100, or between the lower metal ring 354 and the adjacent edge of the cross die 100.

Figure 9C:
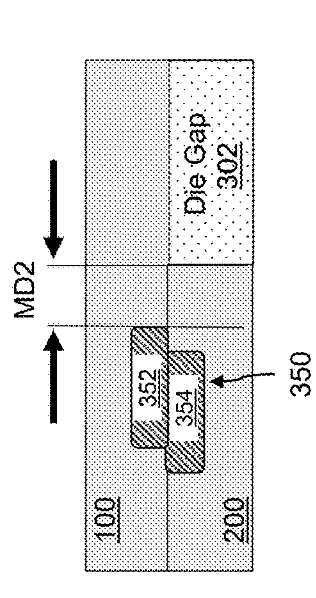
Figure 9E:
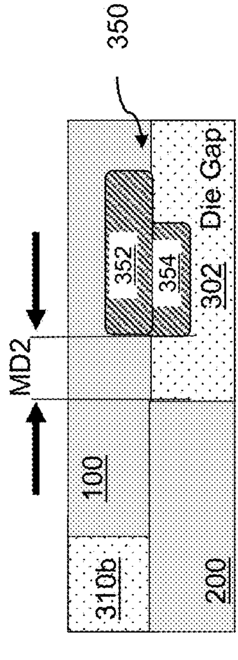

As shown in FIGS. 9C and 9D, the minimum distance MD2 may similarly be measured between the closest portion of a bonding line 360 and an edge of an adjacent edge of a lower die 200 (e.g., an edge of the dielectric region 302). FIG. 9E shows the measurement of minimum distance MD2 in embodiments where the bonding ring 350 is disposed over a dielectric region 302, such as with respect to the bonding ring 350 of the dies 100*c* and 100*e* of FIGS. 8C and 8D. FIG. 9F shows the measurement of minimum distances MD1 and MD2 from the same portion of a bonding ring 350, such as with respect to the bonding ring 350 of second die 100*b* of FIG. 8C.

According to various embodiments, the minimum distance MD2 may also be measured in a similar fashion with respect to the bonding lines 360. For example, the minimum distance MD2 may be measured from the closer of the upper metal line 356 and/or the lower metal line 358 to a corresponding edge of an adjacent lower die 200.

Figure 10B:
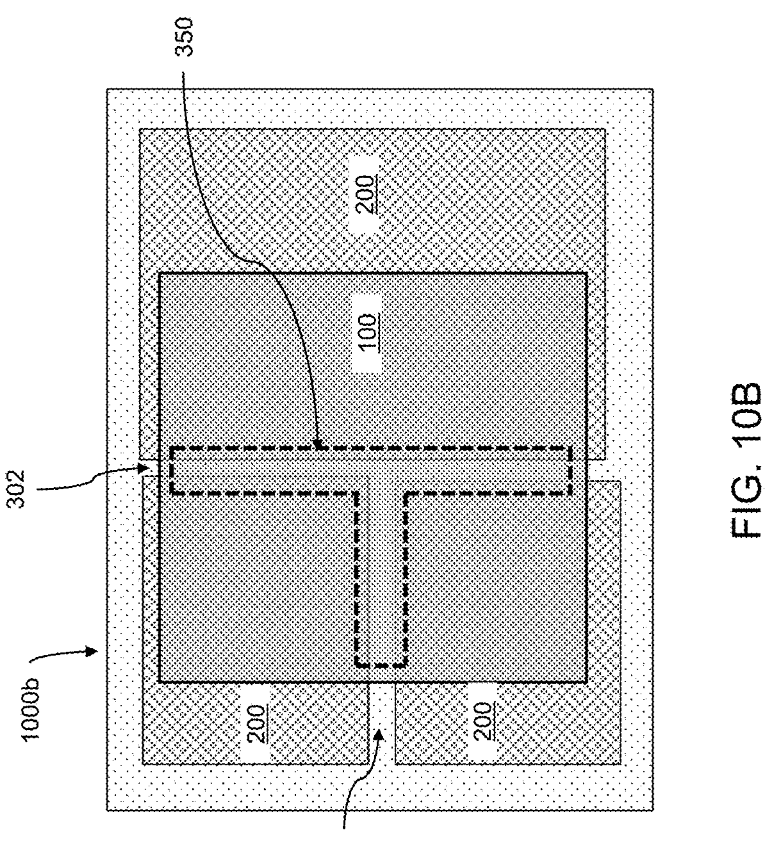
FIGS. 10A-10D are top view of semiconductor devices with alternative metal ring configurations, according to various embodiments of the present disclosure.

FIGS. 10A-10D are top view of semiconductor devices 1000*a*-1000*d*, according to various embodiments of the present disclosure. FIG. 10E is an enlarged view of a portion P1 of FIG. 10D. FIGS. 10F-H show modified versions of FIG. 10E. The semiconductor device 1000*a* may be similar to the semiconductor device 800*a*, the semiconductor device 1000*b* may be similar to the semiconductor device 700*d*, the semiconductor device 1000*c* may be similar to the semiconductor device 800*b*, and the semiconductor device 1000*d* may be similar to the semiconductor device 600*a*. As such, only the differences therebetween will be discussed in detail.

Figure 10A:
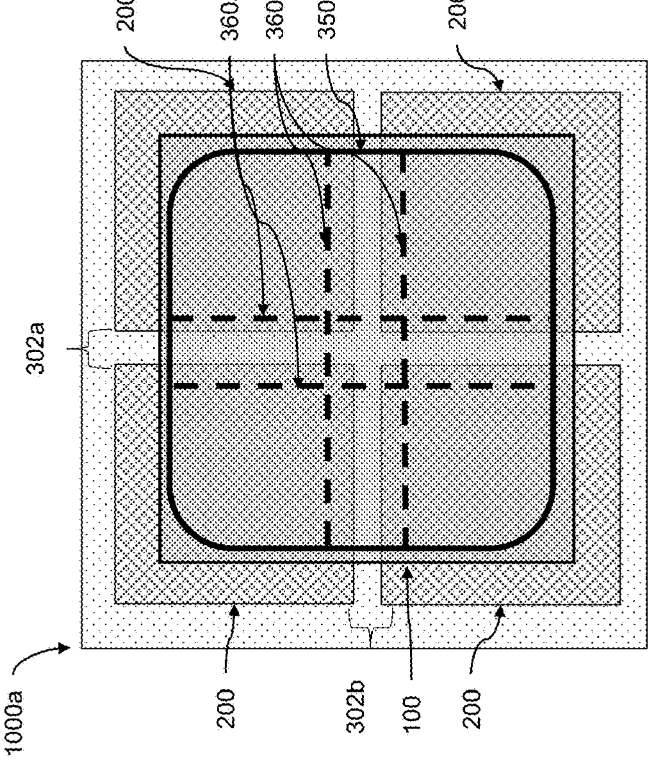

Referring to FIG. 10A, the semiconductor device 1000*a* may include a cross die 100 disposed on four lower dies 200. The semiconductor device 1000*a* may also include a bonding ring 350, first bonding lines 360*a*, and second bonding lines 360*b*. The bonding ring 350 be a continuous rectangular ring that extends along the perimeter of the cross die 100. The first bonding lines 360*a* and second bonding lines 360*b* may be discontinuous lines that extend along edges of the lower dies 200 adjacent to gaps between the lower dies 200.

Referring to FIG. 10B, the semiconductor device 1000*b* may include a cross die 100 disposed on four lower dies 200. The semiconductor device 1000*b* may also include a discontinuous polygonal bonding ring 350 that extends along edges of the lower dies 200 adjacent to one or more gaps between the lower dies 200.

Figures 10C, 10D:
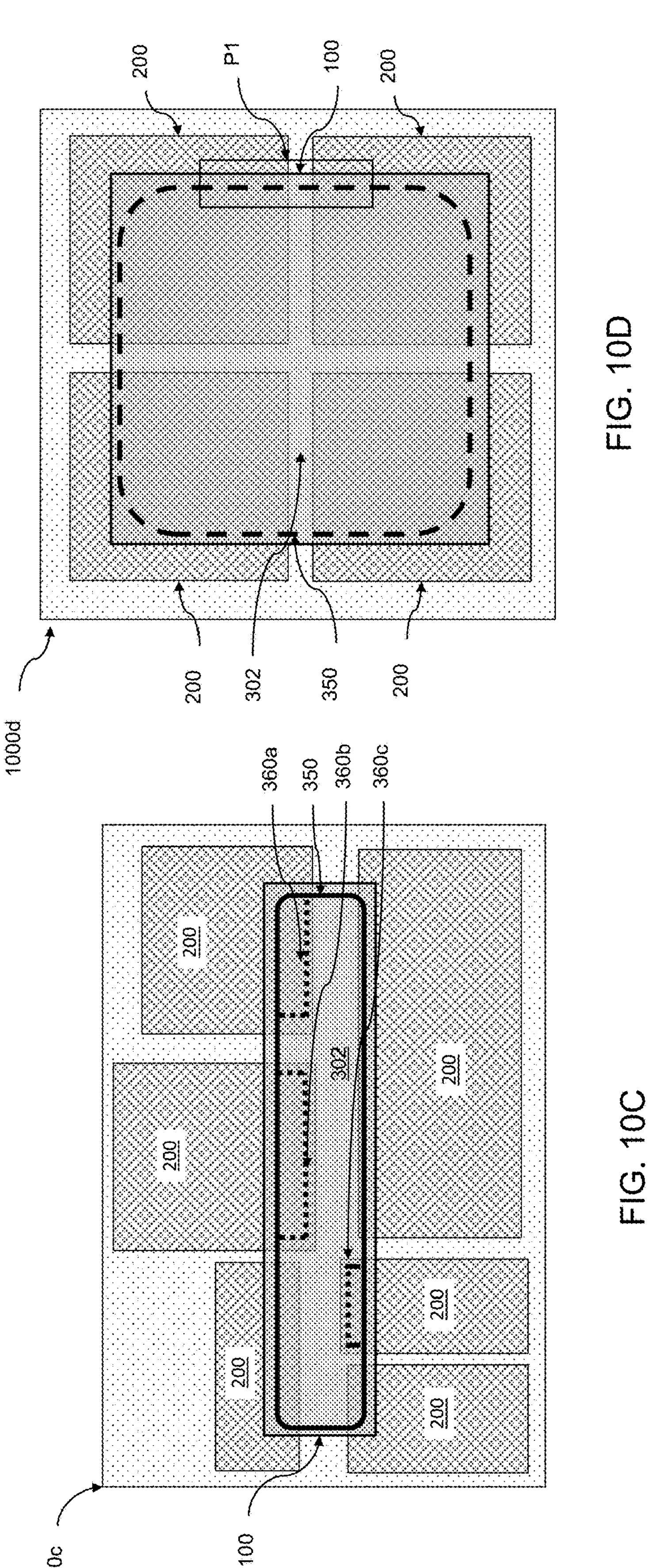
Figure 10H:
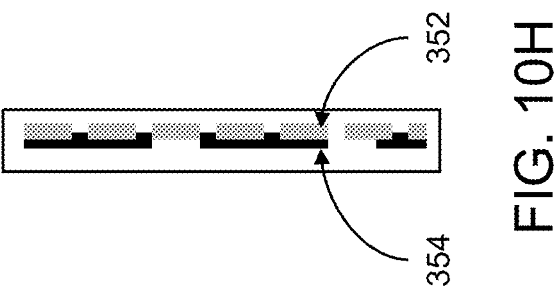
FIGS. 10F-10H are alternative enlarged view of the portion P1 of FIG. 10D.
Figure 10G:
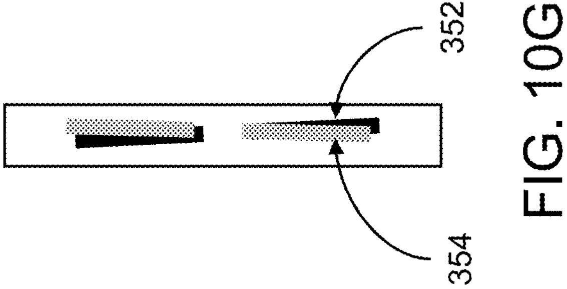
Figure 10F:
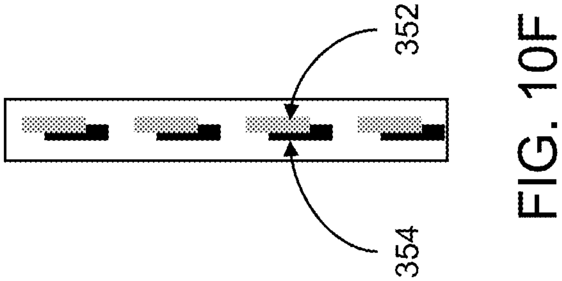
Figure 10E:
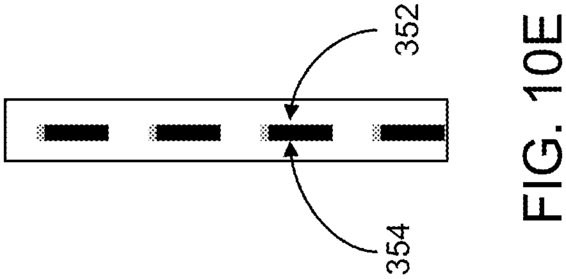
FIG. 10E is an enlarged view of a portion P1 of FIG. 10D.

Referring to FIG. 10C, the semiconductor device 1000*c* may include a cross die 100 disposed on six lower dies 200. The semiconductor device 1000*b* may also include a bonding ring 350, a first bonding line 360*a*, a second bonding line 360*b*, and a third bonding line 360*c*. The bonding ring 350 be a continuous rectangular ring that extends along the perimeter of the cross die 100. The first bonding line 360*a* and second bonding line 360*b* may be discontinuous lines that extend along edges of the lower dies 200 adjacent to one or more gaps between the lower dies 200.

Referring to FIG. 10D, the semiconductor device 1000*d* may include a square cross die 100 disposed on four square lower dies 200. The cross die 200 may include a discontinuous bonding ring 350 having rounded corners.

As shown in FIG. 10E, the discontinuous bonding ring 350 may include a discontinuous upper metal ring 352 and a discontinuous lower metal ring 354. Segments of the upper metal ring 352 and the lower metal ring 354 may be aligned to overlap one another completely or nearly completely and may have the same segmented pattern.

As shown in FIGS. 10F-10H, the segments of the upper metal ring 352 and the lower metal ring 354 may be misaligned and/or may have different patterns, such that an area of overlap may be reduced as compared to an accurately aligned die. However, sufficient bonding strength may be obtained so long as the overlapped area is at least 10%, as discussed above with respect to FIGS. 3A-3F. In addition, discontinuous bonding ring structures may beneficially reduce the local metal density of a die, which may otherwise complicate metal plating and/or CMP. In some embodiments, discontinuous bonding ring structures may provide improved bonding strength, as compared to fusion bonding alone. Dense metal zone might impact Cu plating and CMP performance, which might get poor U % of bonding surface. Thus, a discontinuous bonding ring may reduce local metal density on the die edge and may also provide stronger die bonding force than pure fusion bonding.

FIG. 11 is a flow diagram of a method of forming a semiconductor device, according to various embodiments of the present disclosure. FIGS. 12A-12F are cross-sectional views showing operations of the method of FIG. 11.

Figure 12A:
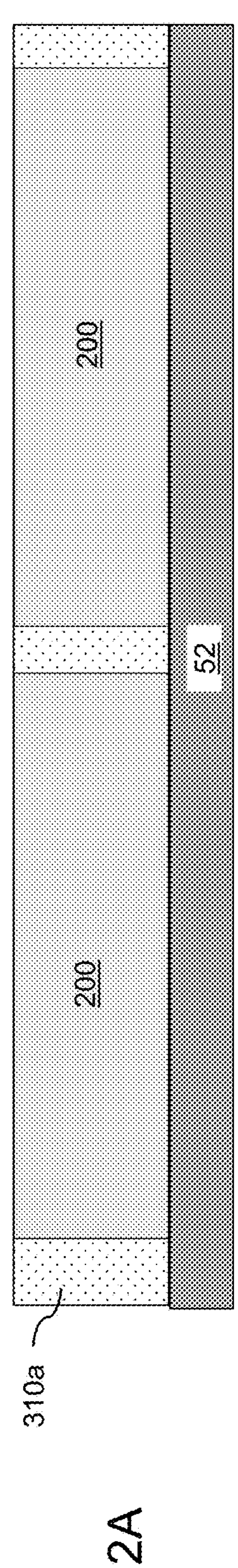
FIGS. 12A-12F are intermediate vertical cross-sectional views showing operations of the method of FIG. 11.

Referring to FIGS. 11 and 12A, in operation 1 lower dies 200 may be disposed on a carrier 52. A lower dielectric layer 310*a* may be deposited on the lower dies 200. The resultant structure may be planarized by CMP, for example, to remove excess dielectric material.

Figure 12B:
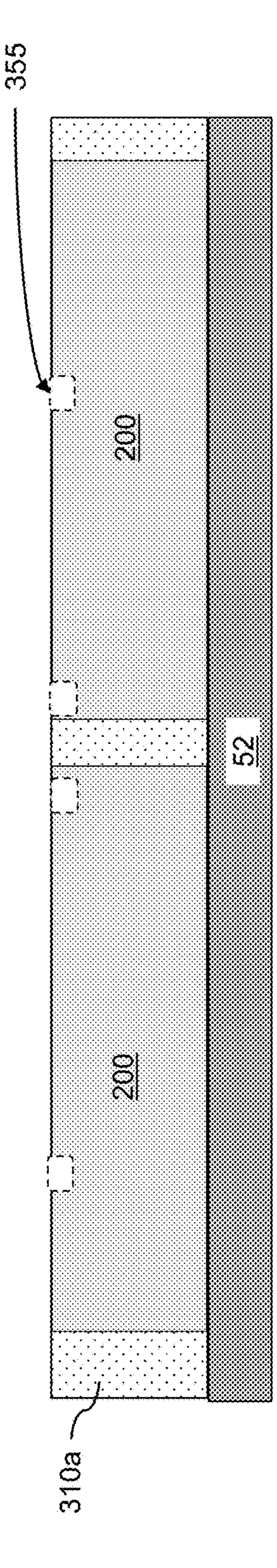

Referring to FIGS. 11 and 12B, in operation 2 the structure of FIG. 12A may be etched to form bonding trenches 355. For example, the structure may be etched using a patterned photoresist layer and a wet or dry etching process. The bonding trenches 355 may extend through the lower dielectric layer 310*a* in a die gap between the lower dies 200.

Figure 12C:
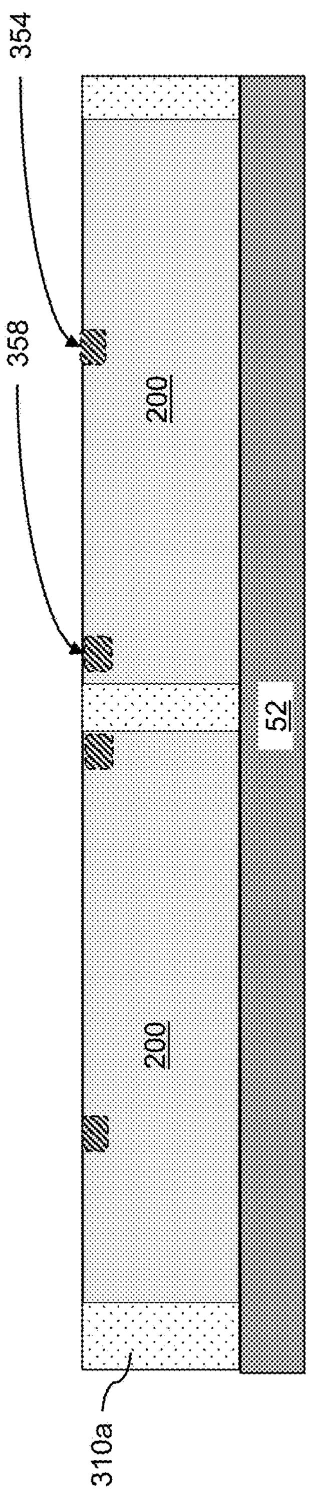

Referring to FIGS. 11 and 12C, in operation 3 a lower metal ring 354 may be formed in the bonding trenches 355. In some embodiments, lower metal lines 358 may also be formed in corresponding bonding trenches 355. In particular, a metal such as copper or a copper alloy may be deposited in the bonding trenches 355 using any suitable deposition method. Excess metal may be removed by CMP or a similar process to planarize the structure and form the lower metal ring 354 and/or lower metal lines 358.

Figures 12D, 12E:
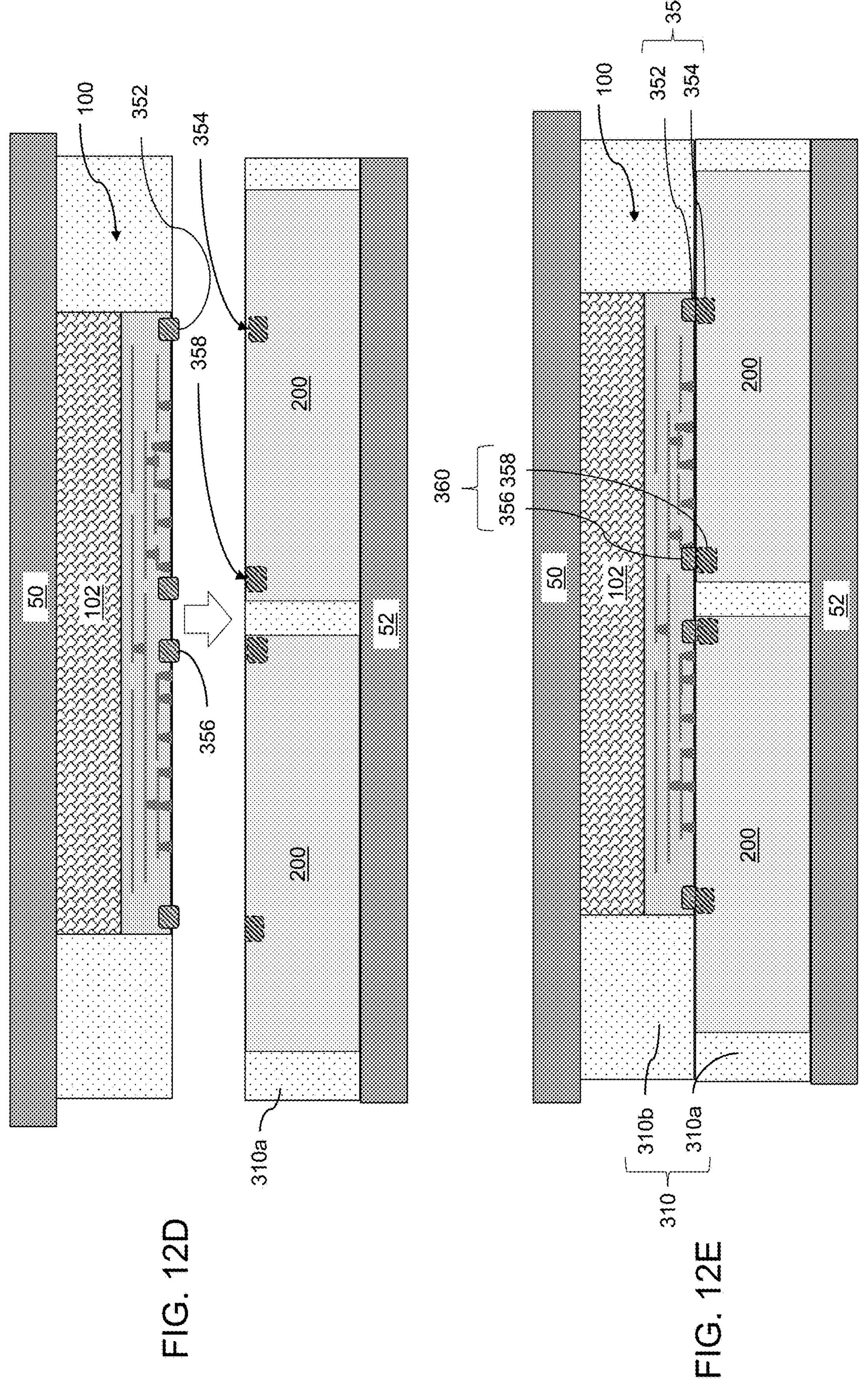

Referring to FIGS. 11 and 12D, in operation 4 an upper metal ring 352 may be formed in a cross die 100 disposed on a carrier 50. Upper metal lines 356 may also optionally be formed in the cross die 100. The upper metal ring 352 and upper metal lines 356 may be formed by an etching, deposition, and planarization process as discussed above with respect to the lower metal ring 354. An upper dielectric layer 310*b* may be deposited around the cross die 100, using any suitable deposition process. Operation 4 may also include planarizing the upper dielectric layer 310*b* using CMP, for example. Referring to FIGS. 11 and 12E, operation 5 may include aligning the cross die 100 and the lower dies 200, such that the upper metal ring 352 and upper metal lines 356 are aligned with the lower metal ring 354 and lower metal lines 358.

Referring to FIGS. 11 and 12E, in operation 6 the cross die 100 is bonded to the lower dies 200. For example, the bonding may include a hybrid bonding process wherein the upper metal ring 352 and the lower metal ring 354 are fused to form a bonding ring 350 and/or the upper metal lines 356 and the lower metal lines 358 are fused to form bonding lines 360. The bonding process may also include bonding the lower dielectric layer 310*a* and the upper dielectric layer 310*b* to form a molding structure 310.

Figure 12F:
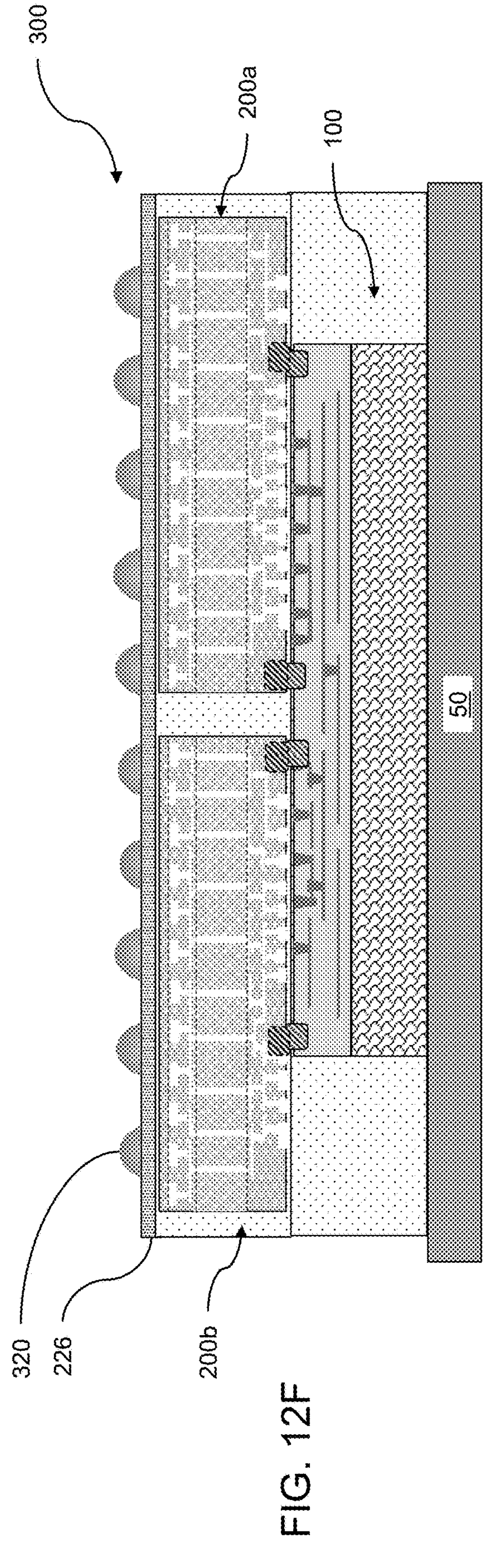

Referring to FIGS. 11 and 12F, in operation 7 the carrier 52 may be removed, and a protective layer 226 may be formed on the lower dies 200 and solder bumps 320 may be formed on the protective layer 226 to complete a semiconductor device 300.

Referring to all drawings and according to various embodiments of the present disclosure, a semiconductor device 300 is provided, which comprises: at least two lower dies 200 separated by a dielectric region 302; a cross die 100 vertically stacked on the lower dies 200 and the dielectric region 302; a molding structure 310 filling the dielectric region 302 and laterally surrounding side surfaces of the lower dies 200 and the cross die 100; and a bonding ring 350 connecting the cross die 100 to the lower dies 200, the bonding ring comprising: an upper metal ring 352 formed in a bottom surface of the cross die 100; and a lower metal ring 354 formed in top surfaces of the lower dies 200 and extending through the molding structure 310 in the dielectric region 302, wherein the lower metal ring 354 is bonded to the upper metal ring 352.

In one embodiment, a minimum distance between at least linear portions of the bonding ring 350 and an adjacent edge of the cross die 100 may be greater than 0 microns (μm) and may be less than 20 μm. In one embodiment, a bottom surface of the upper metal ring 352 contacts at least 10% of a top surface of the lower metal ring 354; or a top surface of the lower metal ring 354 contacts at least 10% of a bottom surface of the upper metal ring 352. In one embodiment, the bottom surface of the upper metal ring 352 may be larger than the top surface of the upper metal ring 352; or a top surface of the lower metal ring 354 may be larger than the bottom surface of the lower metal ring 354. In one embodiment, a minimum distance between at least a portion of the bonding ring 350 and an edge of the dielectric region 302 may be greater than 0 microns (μm) and is less than 20 μm. In one embodiment, with respect to a vertical direction, a thickness of the upper metal ring 352 may be at least 10% of a thickness of the cross die 100; and with respect to the vertical direction, a thickness of the lower metal ring 354 may be at least 10% of a thickness of the lower dies 200. In one embodiment, the thickness of the upper metal ring 352 may be at least 100 angstroms; and the thickness of the lower metal ring 354 may be at least 100 angstroms. In one embodiment, the bonding ring 350 may be discontinuous. In one embodiment, the bonding ring 350 may be rectangular, square-shaped, or polygonal. In one embodiment, the cross die 100 comprises a memory chip, a logic chip, an analog chip, a radio frequency chip or an integrated passive device chip; at least one of the at least two lower dies 200 comprises an interposer 20, or a dummy die; the lower metal ring 354 and the upper metal ring 352 comprise copper or a copper alloy; and the cross die 100 is fusion bonded or hybrid bonded to the at least two lower dies 200.

According to another aspect of the present disclosure, a semiconductor device is provided, which comprises: two lower dies 200 separated by a dielectric region 302; a cross die 100 vertically stacked on the two lower dies 200 and the dielectric region 302; a lower dielectric layer 310*a* filling the dielectric region 302 and surrounding side surfaces of the lower dies 200; an upper dielectric layer 310*b* laterally surrounding side surfaces of the cross die 100; a bonding ring 350 formed in a bottom surface of the cross die 100, top surfaces of the two lower dies 200, and a top surface of the lower dielectric layer 310*a* in the dielectric region, so as to connect the cross die 100 to the two lower dies 200; and bonding lines 360 disposed inside of the bonding ring 350 and connecting the cross die 100 to the two lower dies 200, wherein a portion of the bonding ring 350 is disposed in the lower dielectric layer 310*a* and extends across the dielectric region 302. a bonding ring 350 connecting the cross die 100 to the lower dies 200, the bonding ring 350 comprising: an upper metal ring 352 formed in a bottom surface of the cross die 100; and a lower metal ring 354 formed in top surfaces of the lower dies 200 and extending through the dielectric region 302, wherein the lower metal ring 354 is bonded to the upper metal ring 352; wherein a width of at least one or the upper metal ring 352 and the lower metal ring 354, taken in a horizontal direction, is greater than 25% of a height H1 of the cross die 100 taken in a vertical direction.

In one embodiment, the semiconductor device may also include bonding lines 360 disposed inside of the bonding ring 305 and connecting the cross die 100 to the at least two lower dies 200, the bonding lines 360 including: upper metal lines 356 formed in the bottom surface of the cross die 100; and a lower metal lines 358 formed in the top surface of the lower dies 200, wherein each lower metal line 358 may be bonded to a corresponding upper metal line 356. In one embodiment, the bonding lines 360 may include: first bonding lines 360*a* that extend in a first direction along opposing side of a first portion of the dielectric region 302; and second bonding lines 360*b* that extend in a second direction perpendicular to the first direction, along opposing sides of a second portion of the dielectric region 302. In one embodiment, the first bonding lines 360*a* extend across the second portion of the dielectric region 302; and the second bonding lines 360*b* extend across the first portion of the dielectric region 302. In one embodiment, a minimum distance between at least a portion of the bonding ring 350 and an edge of the cross die 100 may be greater than 0 microns (μm) and is less than 20 μm; and a minimum distance between at least a portion of each bonding line 360 and the dielectric region 302 may be greater than 0 microns (μm) and is less than 20 μm. In one embodiment, a bottom surface of the upper metal line 356 contacts at least 10% of a top surface of the at least two lower metal lines 358; or a top surface of the lower metal line 358 contacts at least 10% of a bottom surface of the upper metal line 356. In one embodiment, the bonding lines 360 each overlap with a single one of the lower dies 100 and do not extend through the dielectric region 302. In one embodiment, the bonding ring 350 may include: an upper metal ring 352 formed in a bottom surface of the cross die 100; and a lower metal ring 354 formed in top surfaces of the lower dies 200 and extending through the dielectric region 302, wherein the lower metal ring 354 is bonded to the upper metal ring 352; and a width of at least one or the upper metal ring 352 and the lower metal ring 354, taken in a horizontal direction, is greater than 25% of a height of the cross die 100 taken in a vertical direction.

According to another aspect of the present disclosure, a semiconductor device 500 is provided, which comprises: lower dies 200 separated by a dielectric region 302; a cross die 100 vertically stacked on the lower dies 200 and the dielectric region 302; a lower dielectric layer310*a* filling the dielectric region and laterally surrounding side surfaces of the at least two lower dies 200; an upper dielectric layer 310*b* laterally surrounding side surfaces of the cross die 100; a molding structure 310 filling the dielectric region 302 and surrounding side surfaces of the lower dies 200 and the cross die 100; a first bonding ring 350*a* connecting the cross die 100 to the lower dies 200, a second bonding ring 350*b* connecting the cross die 100 to the lower dies 200, wherein: the first bonding ring 350*a* and the second bonding ring 350*b* may be disposed on opposing sides of the dielectric region 302; or the first bonding ring 350*a* and the second bonding ring 350*b* may be disposed within the dielectric region 302 and do not vertically overlap with the lower dies 200. In some embodiments, the first bonding ring 350*a* comprises: an upper metal ring 352 formed in a bottom surface of the cross die 100; and a lower metal ring 354 formed in top surfaces of the lower dies 200 or formed in the die gap, wherein the lower metal ring 354 is bonded to the upper metal ring 350. In some embodiments, a minimum distance MD2 between at least a portion of the first bonding ring 350*a* and/or the second bonding ring 350B and an edge of the cross die 100 is greater than 0 microns (μm) and is less than 20 μm.

In one embodiment, the first bonding ring 350*a* may be disposed over the dielectric region 302 and the lower metal ring 354 may be formed only in the dielectric region 302. In one embodiment, the semiconductor device 500 may also include a second bonding ring 350*b* connecting the cross die 100 to the lower dies 200, wherein: In one embodiment, the semiconductor device 500 may also include an upper dielectric layer 310*b* disposed on the lower dielectric layer 310*a* and laterally surrounding the cross die 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

at least two lower dies separated by a dielectric region;

a cross die vertically stacked on the at least two lower dies and the dielectric region;

a lower dielectric layer filling the dielectric region and laterally surrounding side surfaces of the at least two lower dies;

an upper dielectric layer laterally surrounding side surfaces of the cross die;

a bonding ring formed in a bottom surface of the cross die, top surfaces of the two lower dies, and a top surface of the lower dielectric layer in the dielectric region, so as to connect the cross die to the two lower dies; and bonding lines disposed inside of the bonding ring and connecting the cross die to the two lower dies, wherein a portion of the bonding ring is disposed in the lower dielectric layer and extends across the dielectric region.

2. The semiconductor device of claim 1, wherein the bonding lines comprise:

upper metal lines formed in the bottom surface of the cross die; and lower metal lines formed in the top surface of the two lower dies, wherein each lower metal line is bonded to a corresponding upper metal line.

3. The semiconductor device of claim 1, wherein the bonding lines comprise:

first bonding lines that extend in a first direction along opposing sides of a first portion of the dielectric region; and second bonding lines that extend in a second direction perpendicular to the first direction, along opposing sides of a second portion of the dielectric region.

4. The semiconductor device of claim 3, wherein:

the first bonding lines extend across the second portion of the dielectric region; and the second bonding lines extend across the first portion of the dielectric region.

5. The semiconductor device of claim 1, wherein:

a minimum distance between at least a portion of the bonding ring and an edge of the cross die is greater than 0 microns (μm) and is less than 20 μm; and a minimum distance between at least a portion of each bonding line and the dielectric region is greater than 0 microns (μm) and is less than 20 μm.

6. The semiconductor device of claim 1, wherein:

the bonding ring comprises:

an upper metal ring formed in a bottom surface of the cross die; and a lower metal ring formed in top surfaces of the lower dies and extending through the dielectric region, wherein the lower metal ring is bonded to the upper metal ring; and a width of at least one or the upper metal ring and the lower metal ring, taken in a horizontal direction, is greater than 25% of a height of the cross die taken in a vertical direction.

7. The semiconductor device of claim 1, wherein the bonding lines each overlap with a single one of the two lower dies and do not extend through the dielectric region.

8. A semiconductor device comprising:

a first lower die and a second lower die separated by a dielectric region;

a cross die vertically stacked on the first lower die, the second lower die, and the dielectric region;

a lower dielectric layer filling the dielectric region and laterally surrounding side surfaces of the first lower die and the second lower die;

an upper dielectric layer laterally surrounding side surfaces of the cross die;

a bonding ring formed in a bottom surface of the cross die, top surfaces of the first lower die and the second lower die, and a top surface of the lower dielectric layer in the dielectric region, so as to connect the cross die to the two lower dies; and a first bonding line disposed inside of the bonding ring and connecting the cross die to the first lower die; and a second bonding line disposed inside of the bonding ring and connecting the cross die to the second lower die, wherein a portion of the bonding ring is disposed in the lower dielectric layer and extends across the dielectric region.

9. The semiconductor device of claim 8, wherein:

the first bonding line is disposed within a perimeter of the first lower die; and the second bonding line is disposed within a perimeter of the second lower die.

10. The semiconductor device of claim 8, wherein:

the first bonding line extends along at least two edges of the first lower die; and the second bonding line extends along at least two edges of the second lower die.

11. The semiconductor device of claim 10, wherein the first and second bonding lines comprise discontinuous segments.

12. The semiconductor device of claim 8, wherein the bonding ring comprises:

an upper metal ring embedded in the bottom surface of the cross die; and a lower metal ring embedded the top surfaces of the first lower die, the second lower die, and the lower dielectric layer, wherein the lower metal ring is bonded to the upper metal ring.

13. The semiconductor device of claim 12, wherein the lower metal ring extends through the dielectric region.

14. The semiconductor device of claim 12, wherein the upper and lower metal rings comprise discontinuous segments.

15. The semiconductor device of claim 12, wherein a bottom surface of the upper metal ring contacts at least 10% of a top surface of the lower metal ring.

16. A semiconductor device comprising:

four lower dies separated by a dielectric region;

a cross die vertically stacked on the lower dies and the dielectric region;

a lower dielectric layer filling the dielectric region and laterally surrounding side surfaces of the lower dies;

an upper dielectric layer laterally surrounding side surfaces of the cross die;

a bonding ring formed in a bottom surface of the cross die, top surfaces of the lower dies, and a top surface of the lower dielectric layer in the dielectric region, so as to connect the cross die to the lower dies; and bonding lines disposed inside of the bonding ring and connecting the cross die to the lower dies, wherein a portion of the bonding ring is disposed in the lower dielectric layer and extends across the dielectric region.

17. The semiconductor device of claim 16, wherein the bonding lines comprise:

first bonding lines that extend in a first direction along opposing sides of a first portion of the dielectric region; and second bonding lines that extend in a second direction perpendicular to the first direction, along opposing sides of a second portion of the dielectric region.

18. The semiconductor device of claim 17, wherein:

the first bonding lines extend across the second portion of the dielectric region; and the second bonding lines extend across the first portion of the dielectric region.

19. The semiconductor device of claim 16, wherein the bonding ring, the bonding lines, or both the bonding ring and the bonding lines comprise discontinuous segments.

20. The semiconductor device of claim 1, wherein:

the bonding ring comprises:

an upper metal ring formed in a bottom surface of the cross die; and a lower metal ring formed in top surfaces of the lower dies and extending through the dielectric region, wherein the lower metal ring is bonded to the upper metal ring; and a width of at least one or the upper metal ring and the lower metal ring, taken in a horizontal direction, is greater than 25% of a height of the cross die taken in a vertical direction.

* * * * *